United States Patent
Morii

(10) Patent No.: US 11,791,134 B2
(45) Date of Patent: Oct. 17, 2023

(54) IMPEDANCE ADJUSTMENT DEVICE

(71) Applicant: DAIHEN Corporation, Osaka (JP)

(72) Inventor: Tatsuya Morii, Osaka (JP)

(73) Assignee: DAIHEN Corporation, Osaka (JP)

(*) Notice: Subject to any disclaimer, the term of this patent is extended or adjusted under 35 U.S.C. 154(b) by 102 days.

(21) Appl. No.: 17/123,642

(22) Filed: Dec. 16, 2020

(65) Prior Publication Data

US 2021/0202210 A1 Jul. 1, 2021

(30) Foreign Application Priority Data

Dec. 27, 2019 (JP) ................. 2019-238644

(51) Int. Cl.
*H01J 37/00* (2006.01)
*H01J 37/32* (2006.01)

(52) U.S. Cl.
CPC ... *H01J 37/32183* (2013.01); *H01J 2237/334* (2013.01); *H01J 2237/3321* (2013.01)

(58) Field of Classification Search
CPC ......... H01J 37/32183; H01J 2237/3321; H01J 2237/334; H03H 7/40; H03H 7/004
See application file for complete search history.

(56) References Cited

U.S. PATENT DOCUMENTS

| | | |
|---|---|---|
| 7,251,121 B2 | 7/2007 | Bhutta |
| 7,298,128 B2 | 11/2007 | Bhutta |
| 9,196,459 B2 | 11/2015 | Bhutta |
| 9,306,533 B1 | 4/2016 | Mavretic |
| 9,345,122 B2 | 5/2016 | Bhutta |
| 9,496,122 B1 | 11/2016 | Bhutta |
| 9,525,412 B2 | 12/2016 | Mavretic |
| 9,543,122 B2 | 1/2017 | Bhutta |
| 9,584,090 B2 | 2/2017 | Mavretic |
| 9,591,739 B2 | 3/2017 | Bhutta |
| 9,697,991 B2 | 7/2017 | Bhutta |
| 9,728,378 B2 | 8/2017 | Bhutta et al. |
| 9,729,122 B2 | 8/2017 | Mavretic |
| 9,745,660 B2 | 8/2017 | Bhutta |
| 9,755,641 B1 | 9/2017 | Bhutta |
| 9,844,127 B2 | 12/2017 | Bhutta |
| 9,865,432 B1 | 1/2018 | Bhutta |
| 10,026,594 B2 | 7/2018 | Bhutta |
| 10,217,608 B2 | 2/2019 | Mavretic |
| 10,340,879 B2 | 7/2019 | Mavretic et al. |

(Continued)

FOREIGN PATENT DOCUMENTS

JP 2017-69823 A 4/2017

*Primary Examiner* — Tuan T Lam
(74) *Attorney, Agent, or Firm* — Bret E. Field; Bozicevic, Field & Francis LLP

(57) ABSTRACT

An impedance adjustment device includes a variable capacitor unit. A microcomputer changes the capacitance value of the variable capacitor unit by switching on or off PIN diodes included in n capacitor circuits separately. Thus, the impedance on the plasma generator side when viewed from a high frequency power supply is adjusted. When changing the capacitance value of the variable capacitor unit to a target capacitance value, the microcomputer changes the capacitance value to a relay capacitance value different from the target capacitance value. The microcomputer changes the capacitance value to the target capacitance value after the capacitance value is changed to the relay capacitance value.

5 Claims, 11 Drawing Sheets

(56) References Cited

U.S. PATENT DOCUMENTS

| | | | |
|---|---|---|---|
| 10,431,424 B2 | 10/2019 | Mavretic et al. | |
| 10,431,428 B2 * | 10/2019 | Bhutta | H01L 21/31116 |
| 10,454,453 B2 | 10/2019 | Bhutta et al. | |
| 10,455,729 B2 | 10/2019 | Bhutta | |
| 10,460,912 B2 | 10/2019 | Bhutta et al. | |
| 10,483,090 B2 * | 11/2019 | Bhutta | H03H 11/28 |
| 10,707,057 B2 | 7/2020 | Bhutta et al. | |
| 10,727,029 B2 | 7/2020 | Ulrich et al. | |
| 11,050,400 B2 * | 6/2021 | Morii | H03H 7/38 |
| 11,387,078 B2 * | 7/2022 | Morii | H01J 37/241 |
| 2006/0151591 A1 * | 7/2006 | Matsuno | H03H 7/40 |
| | | | 235/91 G |
| 2012/0138081 A1 * | 6/2012 | Lee | A45D 1/04 |
| | | | 132/232 |
| 2016/0065207 A1 | 3/2016 | Bhutta | |
| 2016/0380610 A1 | 12/2016 | Ulrich | |
| 2017/0178865 A1 * | 6/2017 | Ulrich | H01J 37/32183 |
| 2018/0076788 A1 | 3/2018 | Decker et al. | |
| 2019/0172683 A1 | 6/2019 | Mavretic et al. | |
| 2019/0267212 A1 | 8/2019 | Mavretic | |
| 2019/0272978 A1 | 9/2019 | Ahmed et al. | |
| 2019/0326094 A1 | 10/2019 | Bhutta | |
| 2020/0035461 A1 | 1/2020 | Bhutta et al. | |
| 2020/0051788 A1 | 2/2020 | Ulrich | |
| 2020/0066488 A1 | 2/2020 | Ulrich et al. | |
| 2020/0066489 A1 | 2/2020 | Lozic et al. | |
| 2020/0083022 A1 | 3/2020 | Huang et al. | |
| 2020/0126765 A1 | 4/2020 | Ulrich et al. | |

* cited by examiner

F I G. 2

|  | CAPACITANCE VALUE [pF] OF CAPACITOR | STATE OF PIN DIODE | GROUP |
|---|---|---|---|
| CAPACITOR CIRCUIT A1 | 1 | 1 | GROUP G1 |
| CAPACITOR CIRCUIT A2 | 2 | 1 | |
| CAPACITOR CIRCUIT A3 | 4 | 1 | |
| CAPACITOR CIRCUIT A4 | 8 | 1 | |
| CAPACITOR CIRCUIT A5 | 16 | 1 | GROUP G2 |
| CAPACITOR CIRCUIT A6 | 32 | 1 | |
| CAPACITOR CIRCUIT A7 | 64 | 1 | |
| CAPACITOR CIRCUIT A8 | 128 | 0 | |

1 : ON
0 : OFF

FIG. 9
CONVENTIONAL MANNER
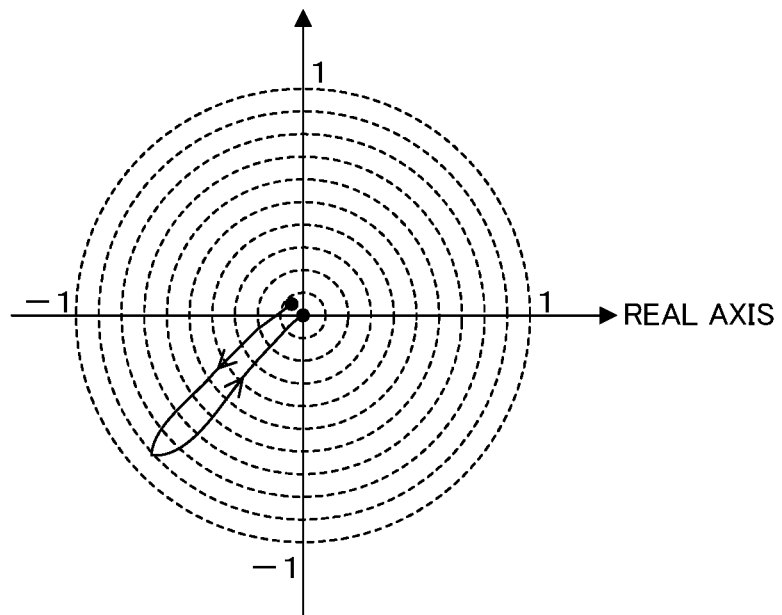
IMPEDANCE ADJUSTMENT DEVICE
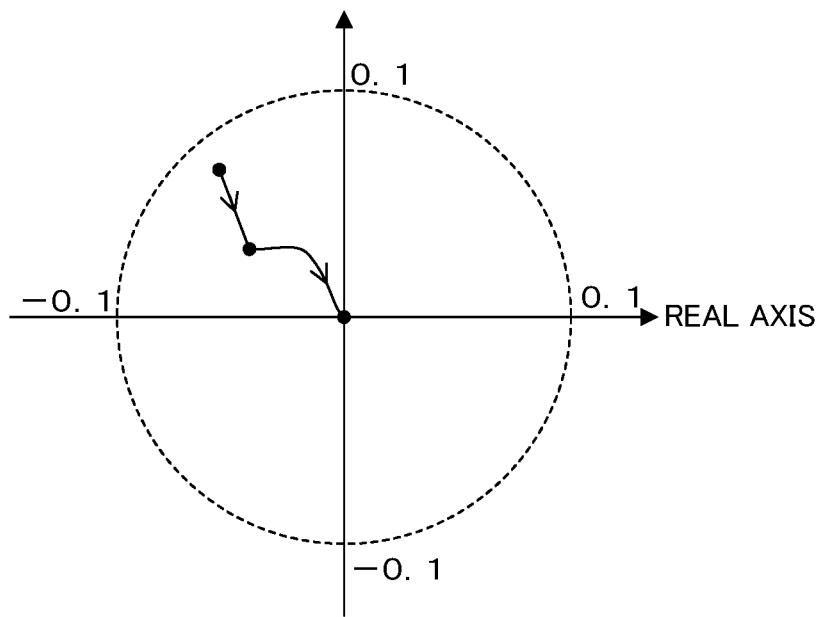

ADJUSTMENT PROCESS

IMPEDANCE ADJUSTMENT DEVICE

CROSS-REFERENCE TO RELATED APPLICATION

This Nonprovisional application claims priority under 35 U.S.C. § 119(a) on Patent Application No. 2019-238644 filed in Japan on Dec. 27, 2019, the entire contents of which are hereby incorporated by reference.

FIELD

The present disclosure relates to an impedance adjustment device.

BACKGROUND

In a configuration in which a high frequency power supply applies a high frequency AC voltage to a load, an impedance adjustment device is disposed in midway of the transmission line of the AC voltage output from the high frequency power supply to the load. The impedance adjustment device adjusts the impedance on the load side when viewed from the high frequency power supply. Japanese Patent Laid-Open Publication No. 2017-69823 discloses an impedance adjustment device. The impedance adjustment device includes a variable capacitor unit. In the variable capacitor unit, a plurality of series circuits are connected in parallel. In each series circuit, a capacitor is connected in series to a semiconductor switch.

The capacitance value of the variable capacitor unit is changed by switching on or off separately a plurality of semiconductor switches included in the variable capacitor unit. By changing the capacitance value of the variable capacitor unit, the impedance on the load side when viewed from the high frequency power supply is adjusted to match the complex conjugate of the output impedance of the high frequency power supply, or is adjusted so that the absolute value of the reflection coefficient on the load side when viewed from the high frequency power supply is minimized. So-called impedance matching is performed. As a result, electric power can be efficiently supplied to the load side.

SUMMARY

In the impedance adjustment device disclosed by Japanese Patent Laid-Open Publication No. 2017-69823, a capacitor is connected in series to a semiconductor switch. Therefore, when the semiconductor switch is switched from OFF to ON, the capacitor connected to the semiconductor switch that is switched on is effective. When the semiconductor switch is switched from ON to OFF, the capacitor connected to the semiconductor switch that is switched off is not effective.

As described above, in the variable capacitor unit, a plurality of series circuit are connected in parallel. In each series circuit, the capacitor is connected in series to the semiconductor switch. Therefore, the total value of the capacitance values of the effective capacitors is the capacitance value of the variable capacitor unit.

When the semiconductor switch is ON, the impedance of the semiconductor switch is very low. When the semiconductor switch is OFF, the impedance of the semiconductor switch is very high. When the semiconductor switch is switched on or off, it takes a short period to complete the change in impedance of the semiconductor switch. That is, the capacitance value of the series circuit in which the capacitor is connected in series to the semiconductor gradually changes.

As a result, depending on the switching situation of the semiconductor switch, the capacitance value of the variable capacitor unit exceeds the upper or lower side of the target capacitance value while changing the capacitance value from the current capacitance value to the target capacitance value. Such a phenomenon can occur when a plurality of semiconductor switches that are switched on or off include: a semiconductor switch that is switched from OFF to ON; and a semiconductor switch that is switched from ON to OFF.

For example, in the conventional variable capacitor unit disclosed by Japanese Patent Laid-Open Publication No. 2017-69823, the capacitance value of each of a plurality of capacitors increases by about twice in order from the minimum capacitance value. In this configuration, a semiconductor switch corresponding to the capacitor having the largest capacitance value is switched from OFF to ON. In addition, all or some of semiconductor switches corresponding to the capacitors having capacitance values equal to or less than the second largest capacitance value are switched from ON to OFF. In this case, the semiconductor switch corresponding to the capacitor having the largest capacitance value may be switched on before the semiconductor switches corresponding to the capacitors having capacitance values equal to or less than the second largest capacitance value are completely switched off. In this case, the capacitance value of the variable capacitor unit rises to a value larger than the target capacitance value. That is, when the direction in which the capacitance value changes from the current capacitance value to the target capacitance value is an increasing direction, the capacitance value may exceed the target capacitance value while the capacitance value changes.

On the contrary, the semiconductor switch corresponding to the capacitor having the largest capacitance value is switched from ON to OFF. In addition, all or some of semiconductor switches corresponding to the capacitors having capacitance values equal to or less than the second largest capacitance value are switched from OFF to ON. In this case, the semiconductor switch corresponding to the capacitor having the largest capacitance value may be switched off before the semiconductor switches corresponding to the capacitors having the second largest capacitance value are completely switched on. In this case, the capacitance value of the variable capacitor unit drops to a value smaller than the target capacitance value. That is, when the direction in which the capacitance value changes from the current capacitance value to the target capacitance value is a decreasing direction, the capacitance value may fall below the target capacitance value while the capacitance value changes.

When such a phenomenon occurs, the load may be adversely affected and the load state may become unstable. In this case, normal impedance matching cannot be performed. In addition, the absolute value of the reflection coefficient approaches 1 so that the load state may be fixed to an unstable state. Such a phenomenon is likely to occur when the capacitance value of the variable capacitor unit greatly exceeds the upper or lower side of the target capacitance value. Therefore, it is necessary to suppress the amount of excess from the target capacitance value so that the amount of excess becomes a small value.

The present disclosure has been made in view of such circumstances, and it is an object of the present disclosure to provide an impedance adjustment device with a small amount of excess from a target capacitance value while the capacitance value of a variable capacitor unit changes from the current capacitance value to the target capacitance value.

An impedance adjustment device according to an aspect of the present disclosure is to be disposed in midway of a transmission line of an AC voltage output from an AC power supply to a load and adjusts an impedance on the load side when viewed from the AC power supply. The impedance adjustment device includes: a variable capacitor unit including a plurality of capacitors and a plurality of semiconductor switches; a changing unit that changes a capacitance value of the variable capacitor unit by switching the plurality of semiconductor switches on or off separately; and a determining unit that determines a target capacitance value of the capacitance value of the variable capacitor unit. In the variable capacitor unit, a plurality of capacitor circuits are connected in parallel. In each capacitor circuit, the capacitor is connected in series to the semiconductor switch. When changing the capacitance value to the target capacitance value determined by the determining unit, the changing unit changes the capacitance value to a relay capacitance value different from the target capacitance value, and changes the capacitance value to the target capacitance value after the capacitance value is changed to the relay capacitance value.

In the aspect described above, when the number of semiconductor switches that are switched on or off in order to change the capacitance value of the variable capacitor unit to the target capacitance value is 2 or more, some of these semiconductor switches are switched on or off. Thus, the capacitance value of the variable capacitor unit is changed to the relay capacitance value. After the relay capacitance value is changed, for example, the remaining semiconductor switches are switched on or off. Thus, the capacitance value of the variable capacitor unit is changed to the target capacitance value.

Therefore, the capacitance value is changed to the target capacitance value after the capacitance value is changed to the relay capacitance value. For this reason, even if the capacitance value of the variable capacitor unit exceeds the upper or lower side of the target capacitance value, the amount of excess is smaller than that when the capacitance values of all the capacitor circuits are changed in a common time zone. Thus, the reflection coefficient does not change greatly. As a result, for example, a possibility that the load state will be prevented from being fixed to an unstable state is high.

In an impedance adjustment device according to an aspect of the present disclosure, the plurality of capacitor circuits are divided into a plurality of groups. The changing unit changes the capacitance value to the relay capacitance value by switching on or off all semiconductor switches that need to be switched for a change to the target capacitance value among semiconductor switches belonging to one group.

In the aspect described above, among semiconductor switches belonging to one group, all semiconductor switches that need to be switched for the change to the target capacitance value are switched on or off. Thus, the capacitance value of the variable capacitor unit is changed from the current capacitance value to the relay capacitance value. For example, the ON or OFF switching of the semiconductor switches described above is performed sequentially for a plurality of groups. Thus, the capacitance value of the variable capacitor unit is changed to the target capacitance value.

In an impedance adjustment device according to an aspect of the present disclosure, the plurality of capacitor circuits are divided into a plurality of groups. A capacitance value range determined by a minimum value and a maximum value of a plurality of capacitance values of capacitors belonging to each group is different from a capacitance value range of another group. When the capacitance value is increased by a change to the target capacitance value, the changing unit changes the capacitance value to the relay capacitance value by switching on or off all semiconductor switches that need to be switched for the change to the target capacitance value among semiconductor switches belonging to a group, for which a value of the capacitance value range is the smallest, among a plurality of groups, each group including a semiconductor switch that needs to be switched on or off.

In the aspect described above, when the capacitance value of the variable capacitor unit is increased by the change to the target capacitance value, one or more semiconductor switches are switched on or off. Here, one or more semiconductor switches are semiconductor switches that need to be switched for the change to the target capacitance value among semiconductor switches belonging to a group, for which the value of the capacitance value range is the smallest, among a plurality of groups, each group including a semiconductor switch that needs to be switched on or off. Therefore, a possibility that the relay capacitance value will exceed the target capacitance value is very low. This switching is effective in a configuration in which the load state is unstable when the capacitance value of the variable capacitor unit is large.

In an impedance adjustment device according to an aspect of the present disclosure, the plurality of capacitor circuits are divided into a plurality of groups. A capacitance value range determined by a minimum value and a maximum value of a plurality of capacitance values of capacitors belonging to each group is different from a capacitance value range of another group. When the capacitance value is decreased by a change to the target capacitance value, the changing unit changes the capacitance value to the relay capacitance value by switching on or off all semiconductor switches that need to be switched for the change to the target capacitance value among semiconductor switches belonging to a group, for which a value of the capacitance value range is the largest, among a plurality of groups, each group including a semiconductor switch that needs to be switched on or off.

In the aspect described above, when the capacitance value of the variable capacitor unit is decreased by the change to the target capacitance value, one or more semiconductor switches are switched on or off. Here, one or more semiconductor switches are semiconductor switches that need to be switched for the change to the target capacitance value among semiconductor switches belonging to a group, for which the value of the capacitance value range is the largest, among a plurality of groups, each group including a semiconductor switch that needs to be switched on or off. Therefore, the relay capacitance value does not exceed the target capacitance value. This switching is effective in a configuration in which the load state is unstable when the capacitance value of the variable capacitor unit is large.

In an impedance adjustment device according to an aspect of the present disclosure, the changing unit changes the capacitance value to the relay capacitance value by switching on or off a semiconductor switch included in one of the plurality of capacitor circuits.

In the aspect described above, the capacitance value of the variable capacitor unit is changed to the relay capacitance value by switching one semiconductor switch on or off. For example, the capacitance value of the variable capacitor unit is changed to the target capacitance value by switching the semiconductor switches on or off one by one. In this case, a plurality of semiconductor switches are not switched on or off in the common time zone. Therefore, when the capacitance value of the variable capacitor unit is changed to the target capacitance value, the capacitance value does not exceed the relay capacitance value and the target capacitance value.

According to the present disclosure, while the capacitance value of the variable capacitor unit changes from the current capacitance value to the target capacitance value, the amount of excess from the target capacitance value is small.

The above and further objects and features will more fully be apparent from the following detailed description with accompanying drawings.

BRIEF DESCRIPTION OF THE DRAWINGS

FIG. 2 is an explanatory diagram of the capacitance value of a variable capacitor unit.

FIG. 9 is an explanatory diagram of the effect of the impedance adjustment device.

DETAILED DESCRIPTION OF NON-LIMITING EXAMPLE EMBODIMENTS

Hereinafter, the present disclosure will be described in detail with reference to the diagrams showing embodiments thereof.

Embodiment 1

Configuration of Power Supply System

Figure 1:
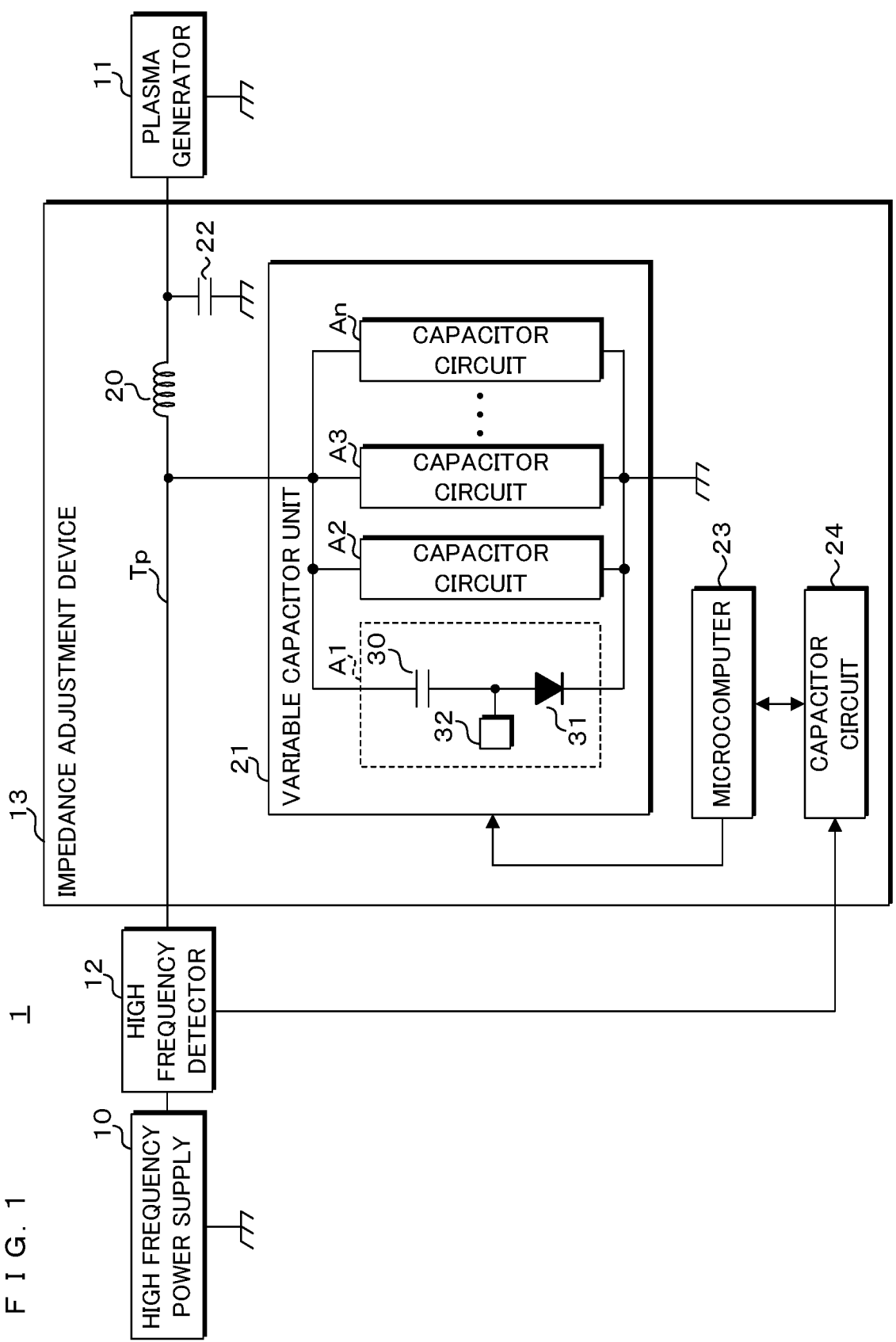
FIG. 1 is a block diagram showing the main configuration of a power supply system according to Embodiment 1.

FIG. 1 is a block diagram showing the main configuration of a power supply system 1 according to Embodiment 1. The power supply system 1 includes a high frequency power supply 10, a plasma generator 11, a high frequency detector 12, and an impedance adjustment device 13. The high frequency power supply 10 is connected to the plasma generator 11 through a transmission line Tp. The high frequency detector 12 and the impedance adjustment device 13 are disposed in midway of the transmission line Tp. The high frequency detector 12 is located between the high frequency power supply 10 and the impedance adjustment device 13. The high frequency power supply 10 and the plasma generator 11 are grounded.

It is noted that the transmission line Tp indicates a transmission line from the high frequency power supply 10 to the plasma generator 11. Therefore, in FIG. 1, the high frequency detector 12 and an inductor 20, which will be described later, are disposed on the transmission line Tp.

The high frequency power supply 10 is an AC power supply that outputs an AC voltage having a high frequency. The frequency of the AC voltage output from the high frequency power supply 10 is a frequency belonging to the industrial radio frequency (RF) band. Frequencies belonging to the industrial RF band are 400 kHz, 2 MHz, 13.56 MHz, 27.12 MHz, 40.68 MHz, 60 MHz, and the like. The high frequency power supply 10 outputs the AC voltage to the plasma generator 11 through the high frequency detector 12 and the impedance adjustment device 13. At this time, the AC voltage output from the high frequency power supply 10 is transmitted through the transmission line Tp. The output impedance of the high frequency power supply 10 is expressed by, for example, only the real part. In this case, the output impedance is, for example, 50Ω. The plasma generator 11 functions as a load.

The plasma generator 11 generates plasma by using the AC voltage input from the high frequency power supply 10. When the type of the plasma generator 11 is a capacitive coupling type, the plasma generator 11 includes a first electrode and a second electrode. The plate surface of the first electrode faces the plate surface of the second electrode. The first electrode is grounded. The AC voltage output from the high frequency power supply 10 is applied to the second electrode. Thus, plasma is generated between the first electrode and the second electrode.

When the type of the plasma generator 11 is an inductive coupling type, the plasma generator 11 includes an inductor. One end of the inductor is grounded. The AC voltage output from the high frequency power supply 10 is applied to the other end of the inductor. Thus, plasma is generated in the inductor.

The plasma generated by the plasma generator 11 is used for processing such as etching or chemical vapor deposition (CVD). In the plasma generator 11, the plasma state changes over time while the process is performed. When the plasma state changes, the impedance of the plasma generator 11 changes.

The high frequency detector 12 periodically detects one of following two parameters. One parameter is a parameter for calculating the impedance on the plasma generator 11 side when viewed from the high frequency power supply 10. The other parameter is a parameter for calculating the reflection coefficient on the plasma generator 11 side when viewed from the high frequency power supply 10. Hereinafter, the impedance on the plasma generator 11 side when viewed from the high frequency power supply 10 will be referred to as a load side impedance. The reflection coefficient when viewed from the high frequency power supply 10 is simply referred to as a reflection coefficient. The reflection coefficient is a complex number. The absolute value of the reflection coefficient is 0 or more and 1 or less.

The load side impedance is one of following two impedances. One impedance is an impedance when the plasma generator 11 side is viewed from the output end of the high frequency power supply 10. The other impedance is an impedance when the plasma generator 11 side is viewed from the input end of the AC voltage in the impedance adjustment device 13. The input end of the impedance adjustment device 13 corresponds to the output end of the high frequency power supply 10. The load side impedance is a combined impedance of the impedance of the impedance adjustment device 13 and the impedance of the plasma generator 11.

The high frequency detector 12 detects, as first example of the parameters, an AC voltage and an AC current transmitted through the high frequency detector 12 and a phase difference between the AC voltage and the AC current. The high frequency detector 12 detects, as second example of the parameters, forward wave power (or forward wave voltage) and reflected wave power (or reflected wave voltage). The forward wave voltage is an AC voltage transmitting toward the plasma generator 11. The forward wave power is the power of the forward wave voltage. The reflected wave voltage is an AC voltage that is reflected by the plasma generator 11 and that transmits toward the high frequency power supply 10. The reflected wave power is the power of the reflected wave voltage. Each time the high frequency detector 12 detects parameters, the high frequency detector 12 outputs, to the impedance adjustment device 13, parameter information indicating the detected parameters.

The impedance adjustment device 13 adjusts the load side impedance by changing the impedance of the impedance adjustment device 13. Specifically, based on the parameter information input from the high frequency detector 12, the impedance adjustment device 13 adjusts the impedance of the impedance adjustment device 13 so that the load side impedance becomes a complex conjugate of the output impedance of the high frequency power supply 10 or so that the reflection coefficient is minimized. So-called impedance matching is performed. Thus, electric power can be efficiently supplied to the load side. When the load side impedance does not become the complex conjugate of the output impedance, the impedance adjustment device 13 adjusts the impedance of the impedance adjustment device 13 so that the load side impedance becomes a value closest to the complex conjugate of the output impedance of the high frequency power supply 10.

Configuration of Impedance Adjustment Device 13

The impedance adjustment device 13 includes the inductor 20, a variable capacitor unit 21, a capacitor 22, a microcomputer 23, and a calculation circuit 24. The inductor 20 is disposed in midway of the transmission line Tp. One end of the variable capacitor unit 21 is connected to one end of the inductor 20 on the high frequency detector 12 side. One end of the capacitor 22 is connected to one end of the inductor 20 on the plasma generator 11 side. The other ends of the variable capacitor unit 21 and the capacitor 22 are grounded.

The circuit including the inductor 20, the variable capacitor unit 21, and the capacitor 22 is a π-type circuit. The circuit included in the impedance adjustment device 13 is not limited to the π type, and may be an L type, a T type, or the like. The following circuit can be mentioned as a first example of the L-type circuit. In this circuit, one end of the variable capacitor unit 21 is connected to one end or the other end of a series circuit including the inductor 20 and the capacitor 22. The other end of the variable capacitor unit 21 is grounded. In this case, the capacitor 22 is disposed in midway of the transmission line Tp and is connected to the plasma generator 11. The following circuit can be mentioned as a second example of the L-type circuit. In this circuit, one end of the capacitor 22 is connected to one end or the other end of a series circuit including the inductor 20 and the variable capacitor unit 21. The other end of the capacitor 22 is grounded. In this case, the variable capacitor unit 21 is disposed in midway of the transmission line Tp and is connected to the high frequency detector 12. It is noted that, instead of the capacitor 22, another variable capacitor unit 21 may be disposed.

The following circuit can be mentioned as an example of the T-type circuit. In this circuit, the inductor 20 is connected in series to another inductor (not shown). One end of the variable capacitor unit 21 is connected to a connection node between the inductor 20 and another inductor. The other end of the variable capacitor unit 21 is grounded.

Hereinafter, an example in which the impedance adjustment device 13 includes a π-type circuit will be described.

The variable capacitor unit 21 includes n capacitor circuits A1, A2, . . . , An connected in parallel. Here, n is an integer of 2 or more. Each of the capacitor circuits A1, A2, . . . , An includes a capacitor 30, a PIN diode 31, and a driving unit 32. In each of the capacitor circuits A1, A2, . . . , An, one end of the capacitor 30 is connected to one end of the inductor 20. The other end of the capacitor 30 is connected to the anode of the PIN diode 31. The cathode of the PIN diode 31 is grounded. In this manner, the capacitor 30 is connected in series to the PIN diode 31. The driving unit 32 is connected to a connection node between the capacitor 30 and the PIN diode 31.

The parallelism of n capacitor circuits A1, A2, . . . , An does not mean strict parallelism, but means substantial parallelism. Therefore, for example, a series circuit of the capacitor circuit A2 and a resistor (not shown) may be connected between both ends of the capacitor circuit A1.

The driving unit 32 applies, to the anode of the PIN diode 31, a positive voltage having reference potential corresponding to a ground potential. Thus, a forward voltage is applied to the PIN diode 31. In addition, the driving unit 32 applies, to the anode of the PIN diode 31, a negative voltage having reference potential corresponding to the ground potential. Thus, a reverse voltage is applied to the PIN diode 31.

In the PIN diode 31, P-type, I-type, and N-type semiconductor layers are bonded to each other. The I-type semiconductor is an intrinsic semiconductor. The I-type semiconductor layer is disposed between the P-type semiconductor layer and the N-type semiconductor layer. An anode and a cathode are provided on the P-type semiconductor layer and the N-type semiconductor layer, respectively. The PIN diode 31 functions as a semiconductor switch.

When the driving unit 32 applies a forward voltage to the PIN diode 31, the resistance value between both ends of the PIN diode 31 drops to a sufficiently small value. As a result, the PIN diode 31 is switched on. When the driving unit 32 applies a reverse voltage to the PIN diode 31, the resistance value between both ends of the PIN diode 31 rises to a sufficiently large value. As a result, the PIN diode 31 is switched off. As described above, the driving unit 32 switches on or off the PIN diode 31 connected to the driving unit 32. When the PIN diode 31 is ON, the AC voltage can pass through the PIN diode 31. When the PIN diode 31 is OFF, the AC voltage cannot pass through the PIN diode 31.

The microcomputer 23 outputs a high level voltage or a low level voltage to the n driving units 32 included in the variable capacitor unit 21. When the voltage input from the microcomputer 23 is switched from the low level voltage to the high level voltage, each driving unit 32 switches the PIN diode 31 on. When the voltage input from the microcomputer 23 is switched from the high level voltage to the low level voltage, each driving unit 32 switches the PIN diode 31 off.

FIG. 2 is an explanatory diagram of the capacitance value of the variable capacitor unit 21. FIG. 2 shows an example in which n is 8. In FIG. 2, the capacitance value of the capacitor 30 and the state of the PIN diode 31 are shown for each of the capacitor circuits A1, A2, . . . , An. ON and OFF are indicated by 1 and 0, respectively.

When the number of PIN diodes 31 in the ON state is 2 or more, the capacitance value of the variable capacitor unit 21 is expressed by the sum of the capacitance values of the plurality of capacitors 30 connected to the plurality of PIN diodes 31 in the ON state. When the number of PIN diodes 31 in the ON state is 1, the capacitance value of the variable capacitor unit 21 is expressed by the capacitance value of the capacitor 30 connected to the PIN diode 31 in the ON state.

The capacitance value of the capacitor 30 included in the capacitor circuit Ai (i=1, 2, . . . , n) is expressed by the product of a positive real number H and (i−1)-th power of 2. In the example of FIG. 2, the real number H is 1 pF. Therefore, the capacitance value of the variable capacitor unit 21 can be adjusted at an interval of the real number H. In the example of FIG. 2, the capacitance value of the variable capacitor unit 21 can be adjusted at an interval of 1 pF. In the example of FIG. 2, since the seven PIN diodes 31 included in the capacitor circuits A1, A2, . . . , A7 are ON, the capacitance value of the variable capacitor unit 21 is 127 pF.

In the impedance adjustment device 13, the n capacitor circuits A1, A2, . . . , An are divided into k groups G1, G2, . . . , Gk. Here, k is an integer of 2 or more and n or less. FIG. 2 shows groups to which the n capacitor circuits A1, A2, . . . , An belong. When the number of groups, that is, k is 2, for example, as shown in FIG. 2, the capacitor circuits A1 to A4 belong to the group G1. The capacitor circuits A5 to A8 belong to the group G2.

The capacitance value range of a group Gj (j=1, 2, . . . , K) is determined by the minimum and maximum values of the capacitors 30 belonging to the group Gj. The capacitance value range of the group Gj is different from the capacitance value ranges of all groups excluding the group Gj among the groups G1, G2, . . . , Gk. In the example of FIG. 2, the capacitance value range of the group G1 is a range of 1 pF to 8 pF. The capacitance value range of the group G2 is a range of 16 pF to 128 pF. The capacitance value ranges of the groups G1 and G2 are different from each other. The value of the capacitance value range of the group G1 is the smallest. As the number of the group increases, the value of the capacitance value range increases. Therefore, the value of the capacitance value range of the group Gk is the largest.

The high frequency detector 12 shown in FIG. 1 outputs parameter information to the calculation circuit 24 of the impedance adjustment device 13. The microcomputer 23 outputs, to the calculation circuit 24, a mask signal configured by a high level voltage and a low level voltage.

The calculation circuit 24 is formed by, for example, a field-programmable gate array (FPGA). The calculation circuit 24 performs a calculation process for calculating the load side impedance or the reflection coefficient. In the calculation process, when the mask signal indicates a low level voltage, the calculation circuit 24 repeatedly calculates the load side impedance or the reflection coefficient during the reference period based on the parameters indicated by the parameter information input from the high frequency detector 12. The calculation circuit 24 calculates an average value of a plurality of load side impedances or an average value of a plurality of reflection coefficients. Here, the plurality of load side impedances or the plurality of reflection coefficients are calculated during the reference period. The calculation circuit 24 outputs, to the microcomputer 23, average information indicating the calculated average value.

The calculation circuit 24 stops the calculation when the mask signal indicates a high level voltage.

When the average information is input from the calculation circuit 24, the microcomputer 23 calculates the capacitance value of the variable capacitor unit 21 based on the average value of the load side impedance or the reflection coefficient indicated by the average information input from the calculation circuit 24. When the average information indicates the average value of the load side impedance, the microcomputer 23 calculates the capacitance value of the variable capacitor unit 21 at which the load side impedance becomes a complex conjugate of the output impedance of the high frequency power supply 10. When the average information indicates the average value of the reflection coefficient, the microcomputer 23 calculates the capacitance value of the variable capacitor unit 21 at which the reflection coefficient becomes 0. The microcomputer 23 determines a target capacitance value of the capacitance value of the variable capacitor unit 21 based on the calculated capacitance value. The target capacitance value is a capacitance value that can be realized in the variable capacitor unit 21. The target capacitance value is a capacitance value that matches the calculated capacitance value or that is closest to the calculated capacitance value.

As described above, the microcomputer 23 switches, to a high level voltage or a low level voltage, each of the output voltages which are output to the n driving units 32 included in the variable capacitor unit 21. Thus, the n PIN diodes 31 included in the variable capacitor unit 21 are switched on or off separately. The microcomputer 23 changes the capacitance value of the variable capacitor unit 21 to the determined target capacitance value by switching the n PIN diodes 31 on or off separately.

Hereinafter, the operations of the calculation circuit 24 and the microcomputer 23 will be described in detail.

Calculation Process of Calculation Circuit 24

Figure 3:
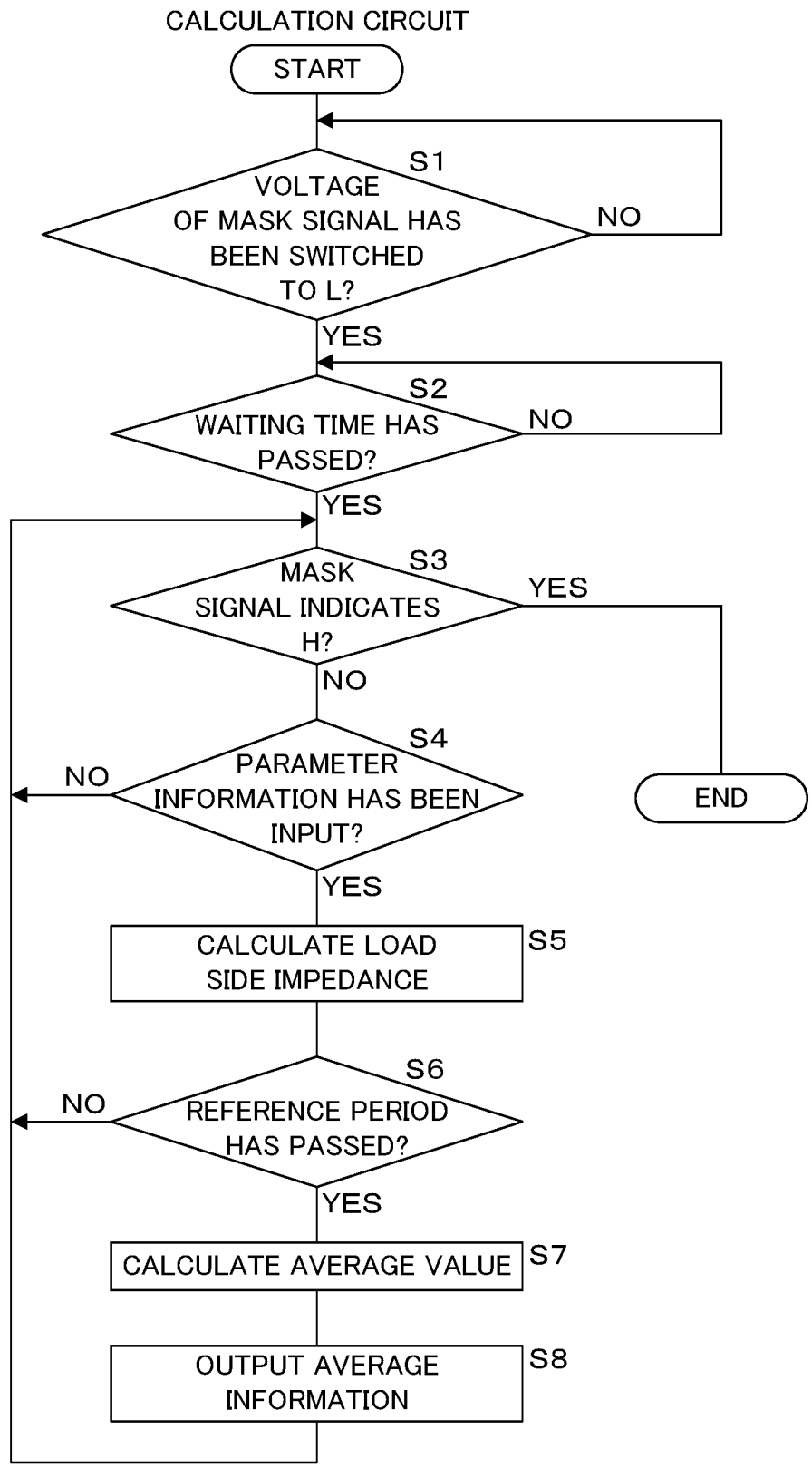
FIG. 3 is a flowchart showing the procedure of a calculation process of a calculation circuit.

FIG. 3 is a flowchart showing the procedure of the calculation process of the calculation circuit 24. In FIG. 3, the high level voltage is indicated by "H" and the low level voltage is indicated by "L". Also in diagrams other than FIG. 3, the high level voltage and the low level voltage are indicated by "H" and "L", respectively. Here, the calculation process for calculating the load side impedance will be described.

The calculation circuit 24 starts the calculation process in a state in which the mask signal input from the microcomputer 23 indicates a high level voltage. In the calculation process, the calculation circuit 24 determines whether or not the voltage of the mask signal input from the microcomputer 23 has been switched from the high level voltage to the low level voltage (step S1). When it is determined that the voltage of the mask signal has not been switched to the low level voltage (S1: NO), the calculation circuit 24 executes step S1 again and waits until the voltage indicated by the mask signal is switched to the low level voltage.

When it is determined that the voltage of the mask signal has been switched to the low level voltage (S1: YES), the calculation circuit 24 determines whether or not the waiting time has passed after the voltage of the mask signal is switched to the low level voltage (step S2). The waiting time is a fixed value, and is set in advance. When the calculation circuit 24 includes a timer (not shown), the timer measures the time that has passed after the voltage of the mask signal is switched to the low level voltage. The calculation circuit 24 determines whether or not the waiting time has passed based on the time measured by the timer. When it is determined that the waiting time has not passed (S2: NO), the calculation circuit 24 executes step S2 again and waits until the waiting time passes.

When it is determined that the waiting time has passed (S2: YES), the calculation circuit 24 determines whether or not the mask signal input from the microcomputer 23 indicates a high level voltage (step S3). When it is determined that the mask signal indicates a high level voltage (S3: YES), the calculation circuit 24 ends the calculation process and starts the calculation process again. When the mask signal does not indicate a high level voltage, that is, when the mask signal indicates a low level voltage (S3: NO), the calculation circuit 24 determines whether or not the parameter information has been input from the high frequency detector 12 (step S4). When it is determined that the parameter information has not been input (S4: NO), the calculation circuit 24 executes step S3 again. When the voltage of the mask signal is maintained at a low level voltage, the calculation circuit 24 waits until the parameter information is input.

When it is determined that the parameter information has been input (S4: YES), the calculation circuit 24 calculates the load side impedance based on the parameters indicated by the parameter information input from the high frequency detector 12 (step S5). As described above, in the calculation process, the calculation circuit 24 outputs the average information to the microcomputer 23. The calculation circuit 24 determines whether or not the reference period has passed after the elapse of the waiting time or after the output of the average information (step S6). The reference period is a fixed value, and is set in advance.

When the calculation circuit 24 includes a timer, the timer measures the time that has passed after the elapse of the waiting time or after the output of the average information. In step S6, the calculation circuit 24 determines whether or not the reference period has passed based on the time measured by the timer.

When it is determined that the reference period has not passed (S6: NO), the calculation circuit 24 executes step S3 again. When the voltage of the mask signal is maintained at a low level voltage, the calculation circuit 24 calculates the load side impedance again. The cycle in which the high frequency detector 12 outputs parameter information is sufficiently shorter than the reference period. Therefore, the calculation circuit 24 executes step S5 twice or more until the reference period passes.

When it is determined that the reference period has passed (S6: YES), the calculation circuit 24 calculates an average value of the plurality of load side impedances calculated until the reference period passes (step S7). Then, the calculation circuit 24 outputs, to the microcomputer 23, average information indicating the calculated average value (step S8). The calculation circuit 24 executes step S3 again after executing step S8.

As described above, when the voltage of the mask signal is maintained at a low level voltage, the calculation circuit 24 repeatedly calculates the load side impedance until the reference period passes. When the reference period passes, the calculation circuit 24 calculates an average value of the plurality of calculated load side impedances. The calculation circuit 24 outputs, to the microcomputer 23, average information indicating the calculated average value. When the voltage of the mask signal is switched to the high level voltage, the calculation circuit 24 stops the calculation of the load side impedance. When the voltage of the mask signal is switched to the low level voltage, the calculation circuit 24 restarts the calculation of the load side impedance and the average value after the waiting time passes from switching to the low level voltage.

The calculation process for calculating the reflection coefficient is similar to the calculation process for calculating the load side impedance. The calculation process for calculating the reflection coefficient can be described by replacing the load side impedance with the reflection coefficient in the description of the load side impedance calculation process.

The calculation circuit 24 may be configured to include a processor that executes processing. The processor is, for example, a central processing unit (CPU). In the case where the calculation circuit 24 includes the processor, in the calculation circuit 24, a computer program is stored in a storage unit (not shown). The processor executes the calculation process by executing the computer program.

The computer program may be stored in a storage medium so as to be readable by the processor of the calculation circuit 24. In this case, the computer program read from the storage medium by a reader (not shown) is written in the storage unit of the calculation circuit 24. The storage medium is an optical disk, a flexible disk, a magnetic disk, a magneto-optical disk, a semiconductor memory, or the like. The optical disk is a compact disc (CD)-read only memory (ROM), a digital versatile disc (DVD)-ROM, a Blu-ray (registered trademark) disc (BD), or the like. The magnetic disk is, for example, a hard disk. In addition, a computer program may be downloaded from an external device (not shown) connected to a communication network (not shown), and the downloaded computer program may be written in a storage unit.

Configuration of Microcomputer 23

Figure 4:
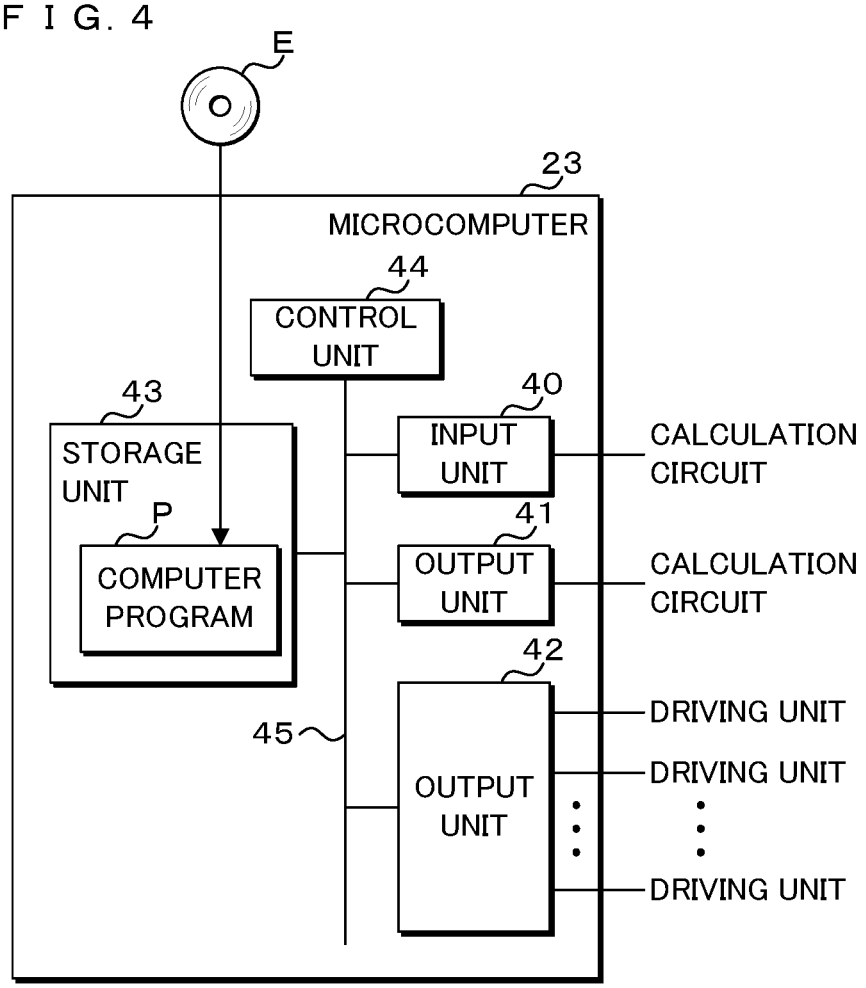
FIG. 4 is a block diagram showing the main configuration of a microcomputer.

FIG. 4 is a block diagram showing the main configuration of the microcomputer 23. The microcomputer 23 includes an input unit 40, output units 41 and 42, a storage unit 43, and a control unit 44. These are connected to an internal bus 45. Each of the input unit 40 and the output unit 41 is further connected to the calculation circuit 24. The output unit 42 is separately connected to n driving units 32 included in the variable capacitor unit 21.

The average information is input from the calculation circuit 24 to the input unit 40. When the average information is input, the input unit 40 notifies the control unit 44 of the average value of the load side impedance or the reflection coefficient indicated by the input average information.

The output unit 41 outputs a mask signal to the calculation circuit 24. The output unit 41 switches the voltage indicated by the mask signal to a high level voltage or a low level voltage according to an instruction from the control unit 44.

The output unit 42 outputs a high level voltage or a low level voltage to the n driving units 32. The output unit 42 switches each of the output voltages which are to be output to the n driving units 32, to a high level voltage or a low level voltage according to an instruction from the control unit 44. As described above, each driving unit 32 switches the PIN diode 31 on or off according to the output voltage.

The control unit 44 instructs the output unit 42 to switch each of the output voltages which are to be output to the n driving units 32, to a high level voltage or a low level voltage. Thus, the control unit 44 separately realizes switchings of the n PIN diodes 31 included in the variable capacitor unit 21 to ON or OFF. The control unit 44 changes the capacitance value of the variable capacitor unit 21 by switching the n PIN diodes 31 on or off separately. The control unit 44 functions as a changing unit.

The storage unit 43 is a non-volatile memory. A computer program P is stored in the storage unit 43. The control unit 44 includes a processor that executes processing. The processor is, for example, a CPU. The processor of the control unit 44 performs an adjustment process by executing the computer program P. In the adjustment process, the load side impedance is adjusted.

The computer program P may be stored in a storage medium E so as to be readable by the processor of the control unit 44. In this case, the computer program P read from the storage medium E by a reader (not shown) is written in the storage unit 43 of the microcomputer 23. The storage medium E is an optical disk, a flexible disk, a magnetic disk, a magnetic optical disk, a semiconductor memory, or the like. In addition, the computer program P may be downloaded from an external device (not shown) connected to a communication network (not shown), and the downloaded computer program P may be written in the storage unit 43.

The number of processors included in the control unit 44 may be 2 or more. In this case, a plurality of processors may cooperatively perform the adjustment process.

Adjustment Process

Figure 5:
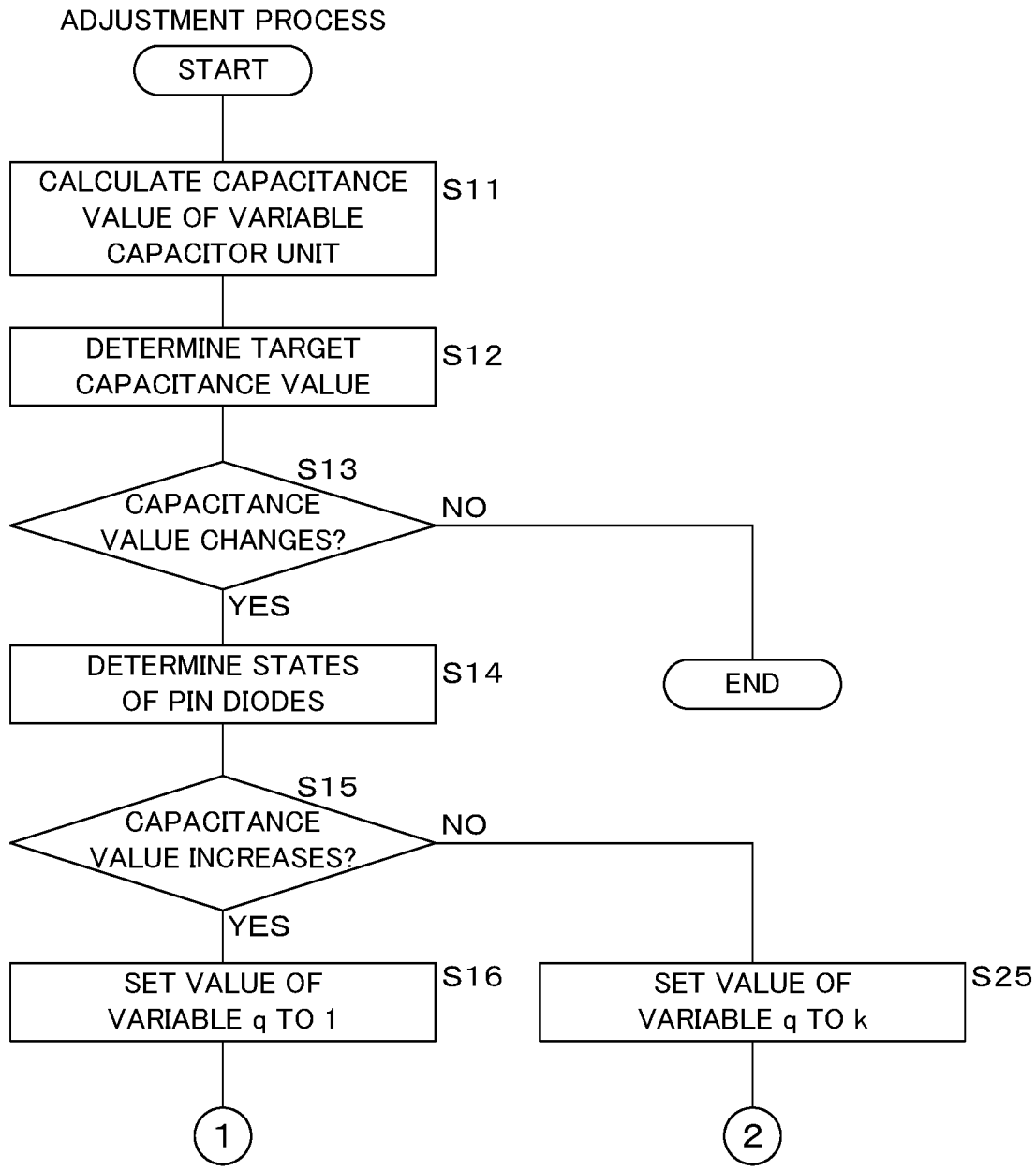
FIG. 5 is a flowchart showing the procedure of an adjustment process.
Figure 6:
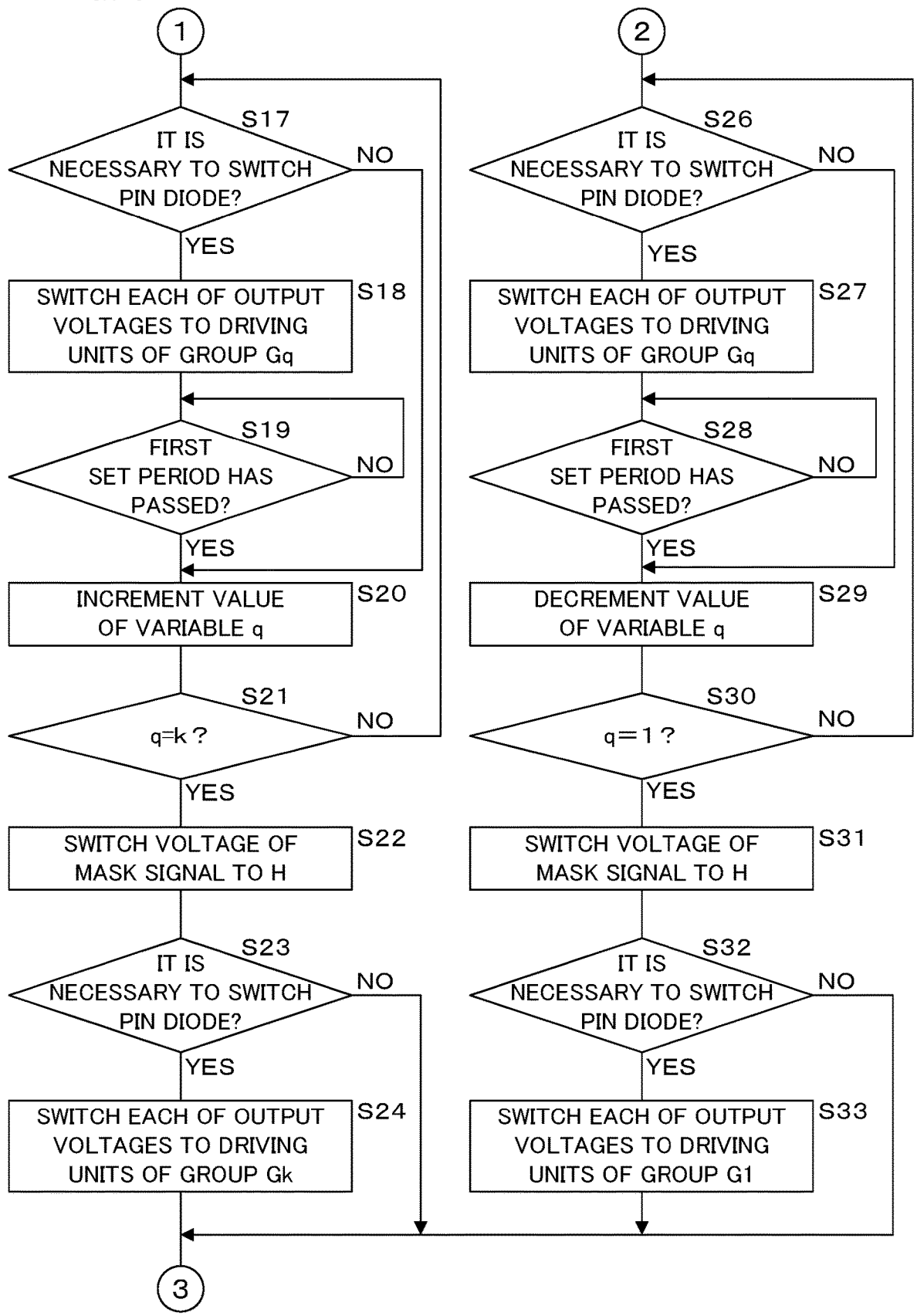
FIG. 6 is a flowchart showing the procedure of the adjustment process.
Figure 7:
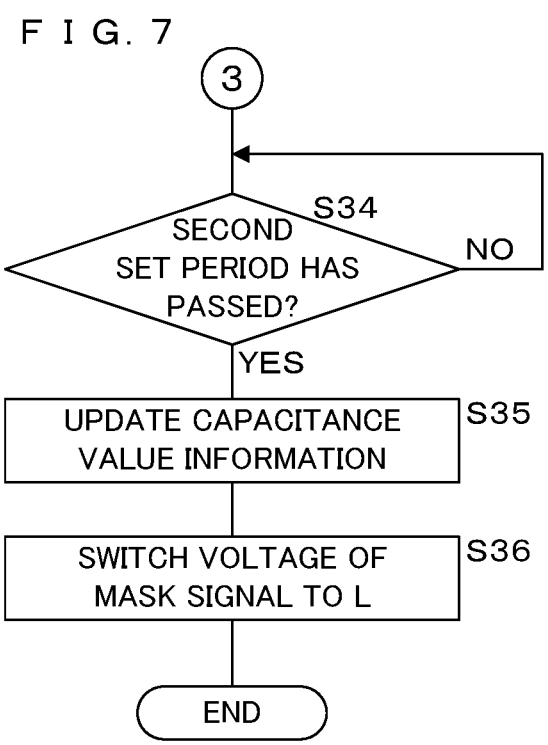
FIG. 7 is a flowchart showing the procedure of the adjustment process.

FIGS. 5, 6, and 7 are flowcharts showing the procedure of the adjustment process. The control unit 44 periodically performs the adjustment process. The storage unit 43 stores: capacitance value information indicating the capacitance value of the variable capacitor unit 21; and the value of a variable q. It is noted that the capacitance value indicated by the capacitance value information is the whole capacitance value of the n capacitor circuits A1, A2, . . . , An included in the variable capacitor unit 21. The capacitance value of the variable capacitor unit 21 can be calculated based on the ON/OFF states of the PIN diodes 31. The capacitance value indicated by the capacitance value information is updated by the control unit 44. The value of the variable q is changed by the control unit 44. The value of the variable q is an integer. The value of the variable q is 1 or more and k or less. As described above, k indicates the number of groups G1, G2, . . . , Gk. In the example of FIG. 2, k is 2. A load side impedance adjustment process performed when the average information indicates the average value of the load side impedance will be described below.

In the adjustment process, first, the control unit 44 calculates the capacitance value of the variable capacitor unit 21, at which the load side impedance matches the complex conjugate of the output impedance of the high frequency power supply 10, based on the average value of the load side impedance (step S11). Here, the average value of the load side impedance is an average value indicated by the latest average information input to the input unit 40. This average value is calculated by the calculation circuit 24. Then, the control unit 44 determines a target capacitance value based on the capacitance value calculated in step S11 (step S12). The target capacitance value is a capacitance value that can be realized in the variable capacitor unit 21. The target capacitance value is a capacitance value that matches the capacitance value calculated in step S11 or that is closest to the calculated capacitance value. The control unit 44 also functions as a determination unit.

It is noted that, as described above, the capacitance value indicated by the capacitance value information can be calculated based on the ON/OFF states of the n PIN diodes 31 included in the variable capacitor unit 21. That is, as the capacitance value information, information indicating the ON/OFF states of the n PIN diodes 31 included in the variable capacitor unit 21 may be used. Similarly, the target capacitance value can also be expressed by the ON/OFF states of the n PIN diodes 31 included in the variable capacitor unit 21.

Then, the control unit 44 determines whether or not the capacitance value of the variable capacitor unit 21 changes when the capacitance value of the variable capacitor unit 21 is changed from the current capacitance value to the target capacitance value determined in step S12 (step S13). The current capacitance value of the variable capacitor unit 21 at the time when step S13 is executed is the capacitance value indicated by the capacitance value information. In step S13, the control unit 44 determines that the capacitance value changes when the target capacitance value determined in step S12 is different from the current capacitance value indicated by the capacitance value information. When the target capacitance value determined in step S12 matches the current capacitance value indicated by the capacitance value information, the control unit 44 determines that the capacitance value does not change.

When the capacitance value of the variable capacitor unit 21 does not change, it is not necessary to change the capacitance value of the variable capacitor unit 21. Therefore, when it is determined that the capacitance value does not change (S13: NO), the control unit 44 ends the adjustment process. When the capacitance value of the variable capacitor unit 21 changes, the capacitance value of the variable capacitor unit 21 is changed to the target capacitance value determined in step S12. Therefore, when it is determined that the capacitance value changes (S13: YES), the control unit 44 determines the states of the n PIN diodes 31 in which the capacitance value of the variable capacitor unit 21 becomes the target capacitance value determined in step S12 (step S14). Specifically, the states of the n PIN diodes 31 shown in FIG. 2 are changed.

Then, the control unit 44 determines whether or not the capacitance value of the variable capacitor unit 21 increases when the capacitance value of the variable capacitor unit 21 is changed to the target capacitance value (step S15). When it is determined that the capacitance value increases (S15: YES), the control unit 44 sets the value of the variable q to 1 (step S16). Then, the control unit 44 determines whether or not it is necessary to switch the PIN diode 31 belonging to a group Gq on or off (step S17). When it is determined that the PIN diode 31 needs to be switched (S17: YES), the control unit 44 switches, to a high level voltage or a low level voltage, each of the output voltages to the driving units 32 of the group Gq (step S18). In step S18, the control unit 44 switches the output voltages to the driving units 32 of the group Gq so that the states of a plurality of PIN diodes 31 belonging to the group Gq become the states of the plurality of PIN diodes 31 determined in step S14.

Thus, among the PIN diodes 31 belonging to the group Gq, all the PIN diodes 31 that need to be switched for the change to the target capacitance value are switched on or off by the driving units 32. It is assumed that the PIN diode 31 that needs to be switched on or off remains at the end of the execution of step S18. In this case, by executing step S18, the capacitance value of the variable capacitor unit 21 is changed to a relay capacitance value different from the target capacitance value.

Then, the control unit 44 determines whether or not a first set period has passed after the execution of step S18 (step S19). The first set period is a fixed value, and is set in advance. When the microcomputer 23 includes a timer (not shown), the control unit 44 causes the timer to measure the time that has passed after the execution of step S18. In step S19, the control unit 44 determines whether or not the first set period has passed based on the time measured by the timer. When it is determined that the first set period has not passed (S19: NO), the control unit 44 executes step S19 again and waits until the first set period passes. By changing the capacitance value of the variable capacitor unit 21, the state of plasma generated by the plasma generator 11 changes. The first set period is longer than the total period of following two periods. One period is the maximum period required to change the capacitance value. The other period is the period required for the plasma state to stabilize.

When it is determined that the switching of the PIN diode 31 belonging to the group Gq is not necessary (S17: NO) or when it is determined that the first set period has passed (S19: YES), the control unit 44 increments the value of the variable q by 1 (step S20). Then, the control unit 44 determines whether or not the value of the variable q is k (step S21). As described above, k is the number of groups G1, G2, . . . , Gk.

When it is determined that the value of the variable q is not k (S21: NO), the control unit 44 executes step S17 again. Thus, the control unit 44 switches the output voltages to the plurality of driving units 32 sequentially from the group G1 to the group Gk−1. The switchings of the output voltages to the plurality of driving units 32 are the switchings of the plurality of PIN diodes 31. When it is determined that the value of the variable q is k (S21: YES), the control unit 44 instructs the output unit 41 to switch, to a high level voltage, the voltage of the mask signal output to the calculation circuit 24 (step S22). Thus, the calculation circuit 24 stops the calculation of the load side impedance.

Then, the control unit 44 determines whether or not it is necessary to switch on or off the PIN diode 31 belonging to the group Gk (step S23). When it is determined that the PIN diode 31 needs to be switched (S23: YES), the control unit 44 switches, to a high level voltage or a low level voltage, each of the output voltages to the driving units 32 of the group Gk (step S24). In step S24, the control unit 44 switches the output voltages to the driving units 32 of the group Gk so that the states of a plurality of PIN diodes 31 belonging to the group Gk become the states of the plurality of PIN diodes 31 determined in step S14. When the PIN diodes 31 belonging to the group Gk include the PIN diode 31 that needs to be switched, the capacitance value of the variable capacitor unit 21 is changed to the target capacitance value by executing step S29.

As described above, as the number of the group increases, the value of the capacitance value range of the group increases. It is assumed that the capacitance value of the variable capacitor unit 21 is increased by changing the capacitance value to the target capacitance value. In this case, the control unit 44 switches on or off all the PIN diodes 31 that need to be switched for the change to the target capacitance value among the PIN diodes 31 belonging to a group, for which the value of the capacitance value range is the smallest, among a plurality of groups, each group including the PIN diode 31 that needs to be switched on or off. Thus, the capacitance value of the variable capacitor unit 21 is changed from the current capacitance value to the relay capacitance value. ON/OFF Switching is performed from one or more PIN diodes 31 belonging to the group for which the value of the capacitance value range is the smallest. Therefore, the relay capacitance value does not exceed the target capacitance value. This switching is effective in a configuration in which the operation of the plasma generator 11 is unstable when the capacitance value of the variable capacitor unit 21 is large.

When it is determined that the capacitance value does not increase (S15: NO), the control unit 44 sets the value of the variable q to k (step S25). The fact that the capacitance value does not increase means that the capacitance value decreases. Then, the control unit 44 determines whether or not it is necessary to switch on or off the PIN diode 31 belonging to the group Gq (step S26). When it is determined that the PIN diode 31 needs to be switched (S26: YES), the control unit 44 switches, to a high level voltage or a low level voltage, each of the output voltages to the driving units 32 of the group Gq in the similar manner as in step S18 (step S27).

Then, as in step S19, the control unit 44 determines whether or not the first set period has passed after the execution of step S27 (step S28). When it is determined that the first set period has not passed (S28: NO), the control unit 44 executes step S28 again and waits until the first set period passes, that is, until the plasma state stabilizes.

When it is determined that the switching of the PIN diode 31 belonging to the group Gq is not necessary (S26: NO) or when it is determined that the first set period has passed (S28: YES), the control unit 44 decrements the value of the variable q by 1 (step S29). Then, the control unit 44 determines whether or not the value of the variable q is 1 (step S30).

When it is determined that the value of the variable q is not 1 (S30: NO), the control unit 44 executes step S26 again. Thus, the control unit 44 switches the output voltages to the plurality of driving units 32 sequentially for the groups of the group Gk to the group G2. The switchings of the output voltages to the plurality of driving units 32 are the switchings of the plurality of PIN diodes 31. When it is determined that the value of the variable q is 1 (S30: YES), the control unit 44 instructs the output unit 41 to switch, to a high level voltage, the voltage of the mask signal output to the calculation circuit 24 (step S31). Thus, the calculation circuit 24 stops the calculation of the load side impedance.

Then, the control unit 44 determines whether or not it is necessary to switch on or off the PIN diode 31 belonging to the group G1 (step S32). When it is determined that the PIN diode 31 needs to be switched (S32: YES), the control unit 44 switches, to a high level voltage or a low level voltage, each of the output voltages to the driving units 32 of the group G1 (step S33). In step S33, the control unit 44 switches the output voltages to the driving units 32 of the group G1 so that the states of a plurality of PIN diodes 31 belonging to the group G1 become the states of the plurality of PIN diodes 31 determined in step S14. When the PIN diodes 31 belonging to the group G1 include the PIN diode 31 that needs to be switched, the capacitance value of the variable capacitor unit 21 is changed to the target capacitance value by executing step S33.

It is assumed that the capacitance value of the variable capacitor unit 21 is decreased by changing the capacitance value to the target capacitance value. In this case, the control unit 44 switches all the PIN diodes 31 that need to be switched for the change to the target capacitance value among the PIN diodes 31 belonging to a group, for which the value of the capacitance value range is the largest, among a plurality of groups, each group including the PIN diodes 31 that need to be switched on or off. Thus, the capacitance value of the variable capacitor unit 21 is changed from the current capacitance value to the relay capacitance value. ON/OFF Switching is performed from one or more PIN diodes 31 belonging to the group for which the value of the capacitance value range is the largest. Therefore, the relay capacitance value does not exceed the target capacitance value. This switching is effective in a configuration in which the operation of the plasma generator 11 is unstable when the capacitance value of the variable capacitor unit 21 is large.

When it is determined that the switching of the PIN diode 31 belonging to the group Gk is not necessary (S23: NO), when it is determined that the switching of the PIN diode 31 belonging to the group G1 is not necessary (S32: NO), or after executing step S24 or step S33, the control unit 44 determines whether or not a second set period has passed after the execution of step S22 or step S31 (step S34). The second set period is a fixed value, and is set in advance. When the microcomputer 23 includes a timer, the control unit 44 causes the timer to measure the time that has passed after the execution of step S22 or step S31. In step S34, the control unit 44 determines whether or not the second set period has passed based on the time measured by the timer.

When it is determined that the second set period has not passed (S34: NO), the control unit 44 executes step S34 again and waits until the second set period passes. By changing the capacitance value of the variable capacitor unit 21, the load side impedance changes. The second set period is longer than the total period of following two periods. One period is the maximum period required to change the capacitance value in step S24 or step S33. The other period is the period required for the load side impedance to stabilize.

When it is determined that the second set period has passed (S34: YES), the control unit 44 updates the capacitance value indicated by the capacitance value information to the target capacitance value determined in step S12 (step S35). Then, the control unit 44 instructs the output unit 41 to switch, to a low level voltage, the voltage of the mask signal output to the calculation circuit 24 (step S36). Thus, the calculation circuit 24 restarts the calculation of the load side impedance and the average value. After executing step S36, the control unit 44 ends the adjustment process.

The reflection coefficient adjustment process performed when the average information indicates the average value of the reflection coefficient is similar to the load side impedance adjustment process except for the following points. In step S11 of the reflection coefficient adjustment process, the control unit 44 calculates the capacitance value of the variable capacitor unit 21, at which the reflection coefficient becomes 0, based on the average value of the reflection coefficient indicated by the average information input to the input unit 40. When the control unit 44 executes step S22 or step S31, the calculation circuit 24 stops the calculation of the reflection coefficient. When the control unit 44 executes step S36, the calculation circuit 24 restarts the calculation of the reflection coefficient.

Operation of Impedance Adjustment Device 13

Figure 8:
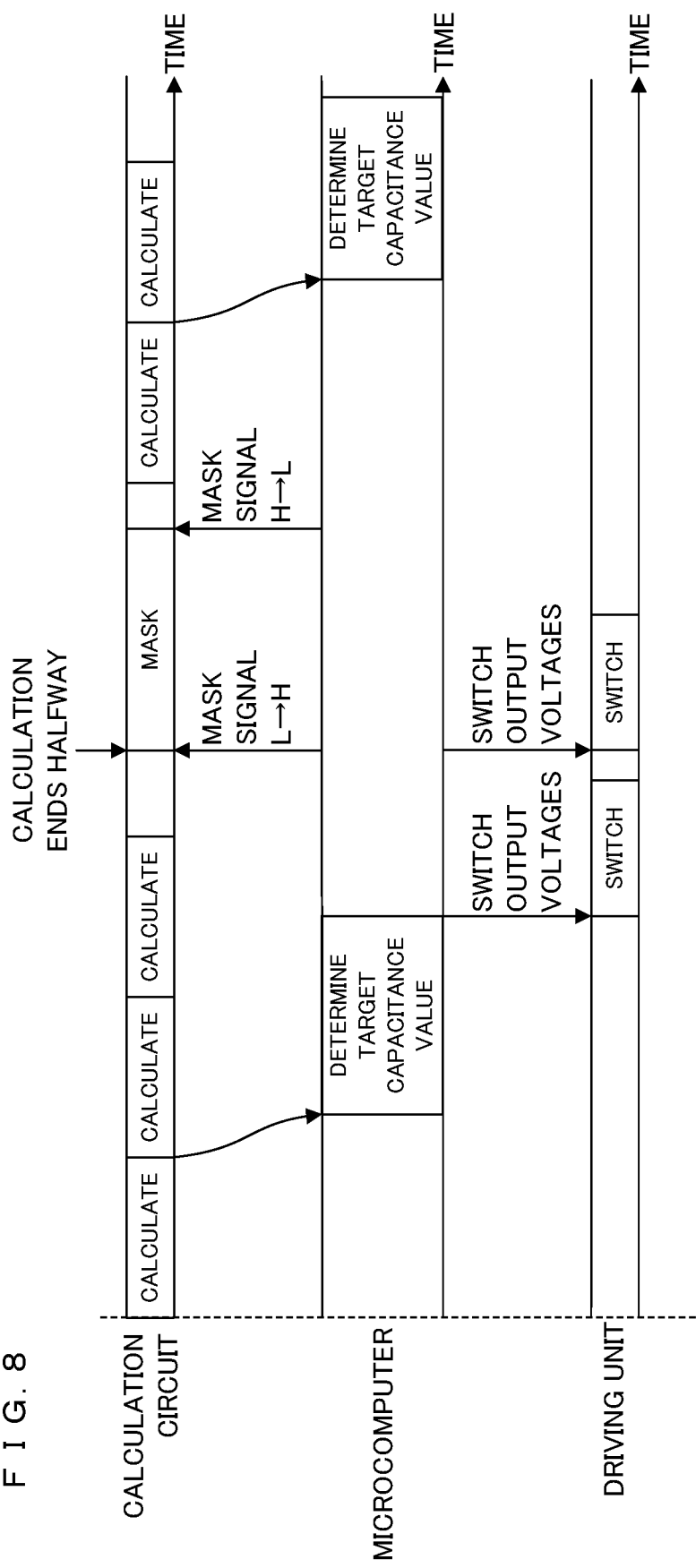
FIG. 8 is a timing chart for describing the operation of an impedance adjustment device.

FIG. 8 is a timing chart for describing the operation of the impedance adjustment device 13. The processes performed by the calculation circuit 24, the microcomputer 23, and the driving unit 32 are shown in chronological order. Here, an example will be described in which the number of groups is 2 and the driving units 32 belonging to the groups G1 and G2 switch the PIN diodes 31 on or off. Also in this description, it is assumed that the calculation circuit 24 calculates the load side impedance. The number of groups is expressed by k.

As shown in FIG. 8, the calculation circuit 24 repeatedly calculates a plurality of load side impedances during the reference period. The calculation circuit 24 calculates an average value of the plurality of calculated load side impedances. The calculation circuit 24 repeatedly performs the series of calculations except for following two periods. One period is a period during which the voltage of the mask signal is a high level voltage. The other period is a period until the waiting time passes after the voltage of the mask signal is switched to the low level voltage. The calculation circuit 24 outputs, to the microcomputer 23, average information indicating the average value of the load side impedance each time a series of calculations end.

The microcomputer 23 calculates the capacitance value of the variable capacitor unit 21 based on the average value of the load side impedance indicated by the latest average information input from the calculation circuit 24. Here, the calculated capacitance value is the capacitance value of the variable capacitor unit 21 realizing that the load side impedance matches the complex conjugate of the output impedance of the high frequency power supply 10. The microcomputer 23 determines a target capacitance value based on the calculated capacitance value.

It is assumed that the capacitance value of the variable capacitor unit 21 is increased by changing the capacitance value to the target capacitance value. In this case, the microcomputer 23 switches on or off all the PIN diodes 31 that need to be switched for the change to the target capacitance value among the PIN diodes 31 belonging to the group G1 for which the value of the capacitance value range is small. Thus, the capacitance value of the variable capacitor unit 21 is changed to the relay capacitance value. Specifically, the microcomputer 23 causes the driving units 32 to switch the PIN diodes 31 by switching the output voltages to the driving units 32. After the first set period passes after the change of the capacitance value to the relay capacitance value, the microcomputer 23 switches on or off all the PIN diodes 31 that need to be switched for the change to the target capacitance value among the PIN diodes 31 belonging to the group G2. Thus, the capacitance value of the variable capacitor unit 21 is changed to the target capacitance value. The value of the capacitance value range of the group G2 is larger than that of the group G1.

It is assumed that the capacitance value of the variable capacitor unit 21 is decreased by changing the capacitance value to the target capacitance value. In this case, the microcomputer 23 switches on or off all the PIN diodes 31 that need to be switched for the change to the target capacitance value among the PIN diodes 31 belonging to the group G2 for which the value of the capacitance value range is large. Then, after the first set period passes after the change of the capacitance value to the relay capacitance value, the microcomputer 23 switches on or off all the PIN diodes 31 that need to be switched for the change to the target capacitance value among the PIN diodes 31 belonging to the group G1. The value of the capacitance value range of the group G1 is smaller than that of the group G2.

The microcomputer 23 switches on or off the PIN diodes 31 belonging to the last group relevant to the change of the capacitance value of the variable capacitor unit 21, and switches the voltage of the mask signal from the low level voltage to the high level voltage. After the second set period passes after the voltage of the mask signal is switched to the high level voltage, the microcomputer 23 returns the voltage of the mask signal voltage to the low level voltage. After the waiting time passes after the voltage of the mask signal is returned to the low level voltage, the calculation circuit 24 repeats the series of calculations again.

Effect of Impedance Adjustment Device 13

FIG. 9 is an explanatory diagram of the effect of the impedance adjustment device 13. In FIG. 9, a reflection coefficient when viewed from the high frequency power supply 10 is shown in the Smith chart. In FIG. 9, the equal resistance circle, the equal reactance circle, and the like used in the Smith chart are omitted. In FIG. 9, a circle showing the absolute value of the reflection coefficient is shown by a broken line. The absolute value of the reflection coefficient corresponding to the origin of the Smith chart is 0. The reflection coefficient is a complex number. Here, an example will be described in which the microcomputer 23 performs the adjustment process to adjust the load side impedance so that the reflection coefficient becomes 0.

In the example of FIG. 2, seven PIN diodes 31 included in the capacitor circuits A1, A2, . . . , A7 are ON. In addition, one PIN diode 31 included in the capacitor circuit A8 is OFF. At this time, the capacitance value of the variable capacitor unit 21 is 127 pF. It is assumed that the capacitance value of the variable capacitor unit 21 is changed to 128 pF in order to set the reflection coefficient to 0. In this case, the microcomputer 23 switches off the seven PIN diodes 31 included in the capacitor circuits A1, A2, . . . , A7. In addition, the microcomputer 23 switches on one PIN diode 31 included in the capacitor circuit A8.

In the conventional impedance adjustment device, the microcomputer 23 switches on or off, in common time zone, all the PIN diodes 31 that need to be switched in order to change the capacitance value of the variable capacitor unit 21 to the target capacitance value. Therefore, the microcomputer 23 switches off the seven PIN diodes 31 included in the capacitor circuits A1, A2, . . . , A7 in the common time zone. In addition, the microcomputer 23 switches on the one PIN diode 31 included in the capacitor circuit A8 in the common time zone. In such a conventional configuration, the reflection coefficient draws a trajectory as shown on the upper side of FIG. 9, for example.

All the PIN diodes 31 are switched on or off. In addition, the plurality of PIN diodes 31 that are switched on or off in the common time zone include: the PIN diode 31 that is switched on; and the PIN diode 31 that is switched off. Therefore, in a transition period from the start of the change of the capacitance value of the variable capacitor unit 21 until the capacitance value of the variable capacitor unit 21 becomes the target capacitance value from the current capacitance value, the capacitance value of the variable capacitor unit 21 may greatly exceed the target capacitance value. When the capacitance value is exceeded, the absolute value of the reflection coefficient may become a value close to 1. The fact that the absolute value of the reflection coefficient is 1 means total reflection. When the absolute value of the reflection coefficient is a value close to 1, the state of plasma generated by the plasma generator 11 may be fixed to an unstable state.

In the configuration of the impedance adjustment device 13 according to Embodiment 1, the reflection coefficient draws a trajectory as shown on the lower side of FIG. 9. In the Smith chart on the lower side of FIG. 9, a range from −0.1 to +0.1 is shown for each of the real and imaginary axes. In the impedance adjustment device 13, when the capacitance value of the variable capacitor unit 21 is changed from 127 pF to 128 pF, the microcomputer 23 switches off, in the common time zone, four PIN diodes 31 included in the capacitor circuits A1, A2, A3, and A4 belonging to the group G1. Thus, the capacitance value of the variable capacitor unit 21 becomes 112 pF as the relay capacitance value. Switching of the PIN diode 31 on and switching of the PIN diode 31 off are not performed in common time zone. Therefore, in a transition period from the start of the change of the capacitance value of the variable capacitor unit 21 until the capacitance value of the variable capacitor unit 21 becomes the relay capacitance value from the current capacitance value, the capacitance value of the variable capacitor unit 21 does not exceed the target capacitance value. In addition, the capacitance value of the variable capacitor unit 21 does not exceed the relay capacitance value.

The relay capacitance value is a capacitance value between the current capacitance value and the target capacitance value. It is assumed that the capacitor circuits A1, A2, A3, and A4 belonging to the group G1 include: the PIN diode 31 that is switched on in the common time zone; and the PIN diode 31 that is switched off in the common time zone. Even in this case, the possibility that the capacitance value of the variable capacitor unit 21 will exceed the target capacitance value in the transition period until the capacitance value of the variable capacitor unit 21 becomes the relay capacitance value from the current capacitance value is very low.

After the first set period passes after the change of the capacitance value of the variable capacitor unit 21 to the relay capacitance value, the microcomputer 23 performs switching for the group G2. Specifically, the microcomputer 23 switches off, in the common time zone, the three PIN diodes 31 included in the capacitor circuits A5, A6, and A7. In addition, the microcomputer 23 switches on, in the common time zone, the one PIN diode 31 provided in the capacitor circuit A8. Switching the PIN diode 31 on and switching the PIN diode 31 off are performed in the common time zone. Therefore, in a transition period from the start of the change of the capacitance value of the variable capacitor unit 21 until the capacitance value of the variable capacitor unit 21 becomes the target capacitance value from the current capacitance value (relay capacitance value), the capacitance value of the variable capacitor unit 21 may exceed the target capacitance value.

However, the capacitance value is changed to the target capacitance value from the state in which the capacitance value has been changed to the relay capacitance value. It is assumed that the capacitance value of the variable capacitor unit 21 exceeds the target capacitance value. Even in this case, the amount of excess is smaller than that when the capacitance values of all the capacitor circuits A1 to A8 are changed in a common time zone. Therefore, the change in the reflection coefficient is smaller than the conventional change in the reflection coefficient. For this reason, for example, a possibility that the state of plasma generated by the plasma generator 11 will be prevented from being fixed to an unstable state is high.

Embodiment 2

In Embodiment 1, a plurality of PIN diodes 31 belonging to one group are switched on or off. Thus, the capacitance value of the variable capacitor unit 21 is changed to the relay capacitance value. However, in order to realize the change to the relay capacitance value, the number of PIN diodes 31 to be switched on or off may be one.

Hereinafter, the differences between Embodiments 1 and 2 will be described. Other configurations excluding the configuration described below are common to those in Embodiment 1. Therefore, the components common to those in Embodiment 1 are denoted by the same reference numerals. The description of the common components will be omitted.

Adjustment Process

Figure 10:
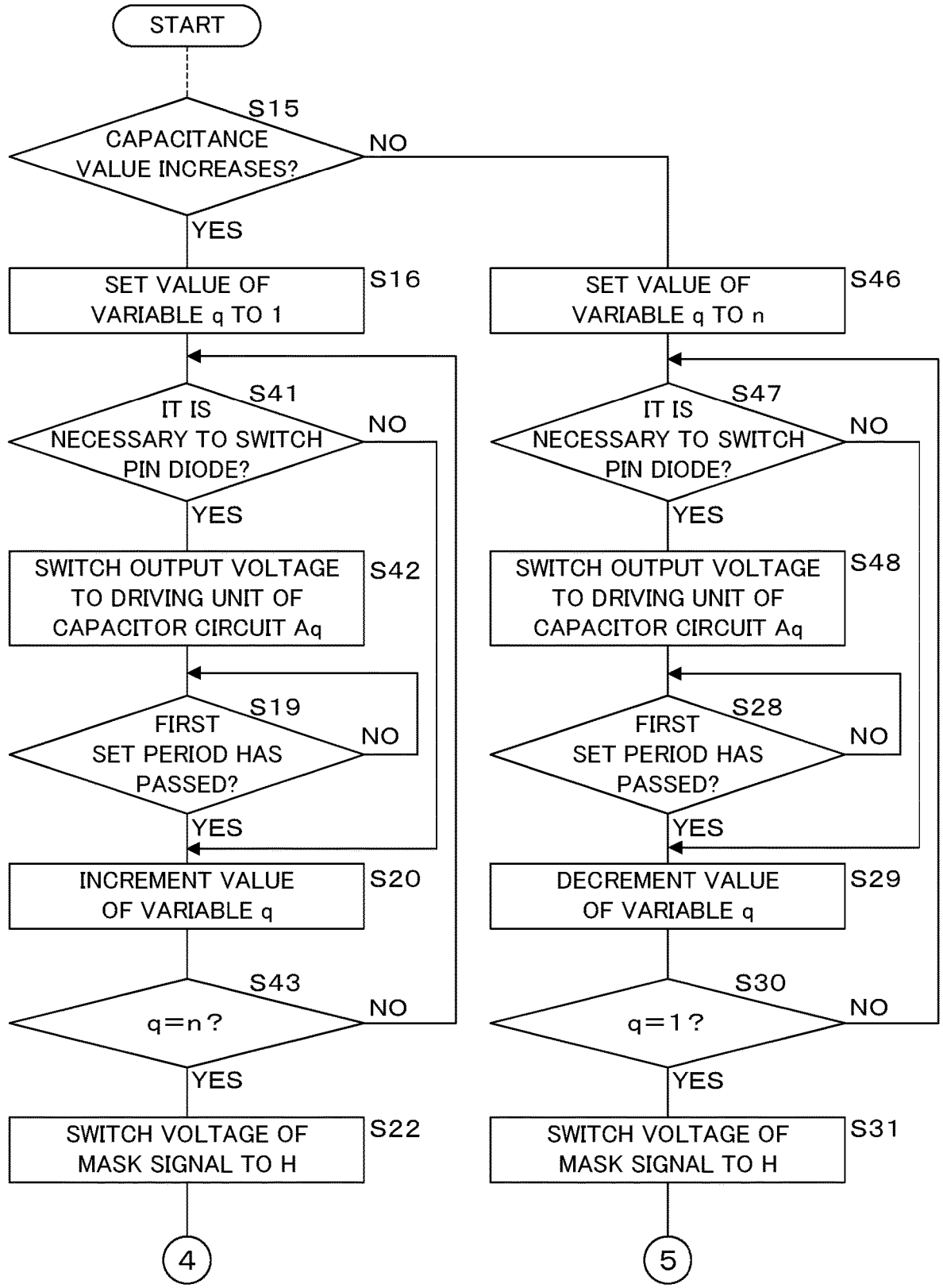
FIG. 10 is a flowchart showing the procedure of an adjustment process according to Embodiment 2.
Figure 11:
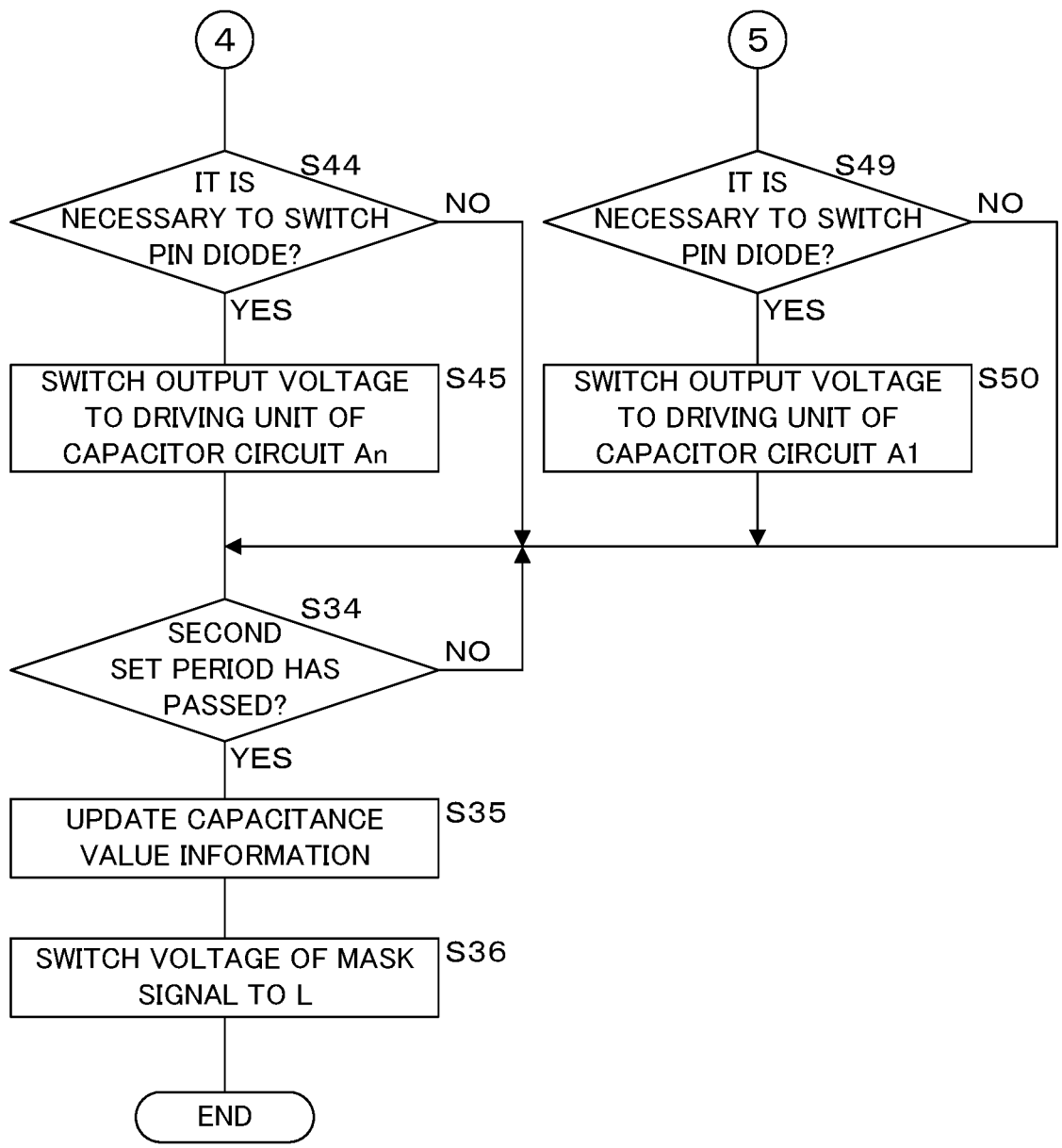
FIG. 11 is a flowchart showing the procedure of the adjustment process according to Embodiment 2.

FIGS. 10 and 11 are flowcharts showing the procedure of an adjustment process according to Embodiment 2. When Embodiment 2 is compared with Embodiment 1, the content of the adjustment process is different. The control unit 44 periodically performs the adjustment process as in Embodiment 1. In Embodiment 2, n capacitor circuits A1, A2, . . . , An are not grouped. When 1 is allowed as the number of capacitor circuits included in one group, a configuration in which the number of groups is n and the number of capacitor circuits belonging to each group is 1 in Embodiment 1 corresponds to the configuration of Embodiment 2. The number of groups is expressed by k.

Steps S11 to S16, S19, S20, S22, S28 to S31, and S34 to S36 of the adjustment process in Embodiment 2 are similar to the adjustment process in Embodiment 1. Therefore, the description of steps S11 to S16, S19, S20, S22, S28 to S31, and S34 to S36 will be omitted.

In the adjustment process according to Embodiment 2, the control unit 44 of the microcomputer 23 determines whether or not it is necessary to switch the PIN diode 31 of the capacitor circuit Aq on or off after setting the value of the variable q to 1 in step S16 (step S41). When it is determined that the PIN diode 31 needs to be switched (S41: YES), the control unit 44 instructs the output unit 42 to switch, to a high level voltage or a low level voltage, the output voltage to the driving unit 32 of the capacitor circuit Aq (step S42). Thus, the PIN diode 31 of the capacitor circuit Aq is switched on or off. It is assumed that the PIN diode 31 that needs to be switched on or off remains at the end of the execution of step S42. In this case, the capacitance value of the variable capacitor unit 21 is changed to the relay capacitance value by executing step S42.

After executing step S42, the control unit 44 executes step S19. When it is determined that the switching of the PIN diode 31 of the capacitor circuit Aq is not necessary (S41: NO) or when it is determined that the first set period has passed (S19: YES), the control unit 44 executes step S20.

After incrementing the value of the variable q by 1 in step S20, the control unit 44 determines whether or not the value of the variable q is n (step S43). As described above, n is the number of capacitor circuits A1, A2, . . . , An. When it is determined that the value of the variable q is not n (S43: NO), the control unit 44 executes step S41 again. When it is determined that the value of the variable q is n (S43: YES), the control unit 44 executes step S22.

After executing step S22, the control unit 44 determines whether or not it is necessary to switch the PIN diode 31 of the capacitor circuit An on or off (step S44). When it is determined that the PIN diode 31 needs to be switched (S44: YES), the control unit 44 instructs the output unit 42 to switch, to a high level voltage or a low level voltage, the output voltage to the driving unit 32 of the capacitor circuit An (step S45). Thus, the PIN diode 31 of the capacitor circuit An is switched on or off. As a result, the capacitance value of the variable capacitor unit 21 is changed to the target capacitance value. When it is determined that it is not necessary to switch the PIN diode 31 of the capacitor circuit An (S44: NO) or after executing step S45, the control unit 44 executes step S34.

In Embodiment 2, as shown in FIG. 2, the capacitance value of the capacitor 30 included in a capacitor circuit having a large number among the capacitor circuits A1, A2, . . . , An is large. The capacitance value of the capacitor 30 included in the capacitor circuit A1 is a minimum value. The capacitance value of the capacitor 30 included in the capacitor circuit An is a maximum value. In the adjustment process according to Embodiment 2, when the capacitance value of the variable capacitor unit 21 is increased by changing the capacitance value to the target capacitance value, the switching of the PIN diode 31 is performed sequentially from the capacitor circuit A1 to the capacitor circuit An.

When it is determined that the capacitance value does not increase (S15: NO), the control unit 44 sets the value of the variable q to n (step S46). The fact that the capacitance value does not increase means that the capacitance value decreases. After executing step S46, the control unit 44 determines whether or not it is necessary to switch the PIN diode 31 of the capacitor circuit Aq on or off (step S47). When it is determined that the PIN diode 31 needs to be switched (S47: YES), the control unit 44 instructs the output unit 42 to switch, to a high level voltage or a low level voltage, the output voltage to the driving unit 32 of the capacitor circuit Aq in the similar manner as in step S42 (step S48). After executing step S48, the control unit 44 executes step S28. When it is determined that the switching of the PIN diode 31 is not necessary (S47: NO) or when it is determined that the first set period has passed (S28: YES), the control unit 44 executes step S29.

After executing step S31, the control unit 44 determines whether or not it is necessary to switch the PIN diode 31 of the capacitor circuit A1 (step S49). When it is determined that the PIN diode 31 needs to be switched (S49: YES), the control unit 44 instructs the output unit 42 to switch, to a high level voltage or a low level voltage, the output voltage to the driving unit 32 of the capacitor circuit A1 (step S50). Thus, the PIN diode 31 of the capacitor circuit A1 is switched on or off. As a result, the capacitance value of the variable capacitor unit 21 is changed to the target capacitance value. When it is determined that it is not necessary to switch the PIN diode 31 of the capacitor circuit A1 (S49: NO) or after executing step S50, the control unit 44 executes step S34.

In the adjustment process according to Embodiment 2, when the capacitance value of the variable capacitor unit 21 is decreased by changing the capacitance value to the target capacitance value, the switching of the PIN diode 31 is performed sequentially from the capacitor circuit An to the capacitor circuit A1.

Effect of Impedance Adjustment Device 13

The number of PIN diodes 31 that can be switched on or off in a common time zone is one. For this reason, switching the PIN diode 31 on and switching the PIN diode 31 off are not performed in the common time zone. Therefore, the capacitance value of the variable capacitor unit 21 does not exceed the relay capacitance value and the target capacitance value. As a result, the reflection coefficient does not change greatly as compared with a conventional case, so that the state of plasma generated by the plasma generator 11 is prevented from being fixed to an unstable state. In addition, in the impedance adjustment device 13 according to Embodiment 2, the relay capacitance value does not exceed the target capacitance value as in Embodiment 1.

Modification Examples

The adjustment process performed by the control unit 44 of the microcomputer 23 may be a process in which the adjustment processes according to Embodiments 1 and 2 are combined. Specifically, in Embodiment 1, k groups G1, G2, . . . , Gk may include: a group in which the number of capacitor circuits is 1; and a group in which the number of capacitor circuits is 2 or more.

In Embodiments 1 and 2, the number of variable capacitor units 21 included in the impedance adjustment device 13 is not limited to one. The number of variable capacitor units 21 may be two or more. As described in the description of Embodiment 1, the variable capacitor unit 21 may be disposed instead of the capacitor 22. When the number of the variable capacitor units 21 is 2 or more, the control unit 44 of the microcomputer 23 performs the adjustment process for each variable capacitor unit 21.

In Embodiments 1 and 2, there is no problem as long as the PIN diode 31 functions as a semiconductor switch. Therefore, a field effect transistor (FET), a bipolar transistor, a thyristor, or the like may be used instead of the PIN diode 31. The load to which the high frequency power supply 10 outputs an AC voltage is not limited to the plasma generator 11. For example, the load to which the high frequency power supply 10 outputs an AC voltage may be a non-contact power transmission device. In addition, the capacitance value of the capacitor 30 of each of the capacitor circuits A1, A2, . . . , An may be the same as the capacitance value of the capacitor 30 of another capacitor circuit.

It is noted that, as used herein and in the appended claims, the singular forms "a", "an", and "the" include plural referents unless the context clearly dictates otherwise.

The technical features (configuration requirements) described in Embodiments 1 and 2 can be combined with each other, and new technical features can be formed by combining these.

It should be considered that Embodiments 1 and 2 disclosed are examples in all points and not restrictive. The scope of the invention is defined by the claims rather than the meanings set forth above, and is intended to include all modifications within the scope and meaning equivalent to the claims.

What is claimed is:

1. An impedance adjustment device that is to be disposed in a transmission line of an AC voltage output from an AC power supply to a load and that adjusts an impedance on the load side when viewed from the AC power supply, comprising:
   a variable capacitor unit in which a plurality of capacitor circuits are connected in parallel, each of the capacitor circuits comprising a capacitor and a semiconductor switch connected in series to each other; and
   a processor connected to the variable capacitor unit,
   wherein the processor determines a target capacitance value of the variable capacitor unit,
   the processor changes the capacitance value of the variable capacitor unit to the determined target capacitance value by switching the semiconductor switches of the capacitor circuits on or off separately, and
   when changing a current capacitance value of the variable capacitor unit to the determined target capacitance value, the processor changes the current capacitance value to a relay capacitance value different from the target capacitance value by switching some of the semiconductor switches that need to be switched for the change to the target capacitance value on or off and changes the relay capacitance value to the target capacitance value by switching the others of the semiconductor switches that need to be switched for the change to the target capacitance value on or off after the current capacitance value is changed to the relay capacitance value,
   wherein a process of changing the current capacitance value to the relay capacitance value when the capacitance value is increased by a change to the target capacitance value and a process of changing the current capacitance value to the relay capacitance value when the capacitance value is decreased by a change to the target capacitance value are different.

2. The impedance adjustment device according to claim 1, wherein the plurality of capacitor circuits are divided into a plurality of groups, and
   the processor changes the capacitance value to the relay capacitance value by switching on or off all semiconductor switches that need to be switched for a change to the target capacitance value among semiconductor switches belonging to one group.

3. The impedance adjustment device according to claim 1, wherein the plurality of capacitor circuits are divided into a plurality of groups,
   a capacitance value range determined by a minimum value and a maximum value of a plurality of capacitance values of capacitors belonging to each group is different from a capacitance value range of another group, and
   when the capacitance value is increased by a change to the target capacitance value, the processor changes the capacitance value to the relay capacitance value by switching on or off all semiconductor switches that need to be switched for the change to the target capacitance value among semiconductor switches belonging to a group, for which a value of the capacitance value range is the smallest, among a plurality of groups, each group including a semiconductor switch that needs to be switched on or off.

4. The impedance adjustment device according to claim 1, wherein the plurality of capacitor circuits are divided into a plurality of groups,
   a capacitance value range determined by a minimum value and a maximum value of a plurality of capacitance values of capacitors belonging to each group is different from a capacitance value range of another group, and
   when the capacitance value is decreased by a change to the target capacitance value, the processor changes the capacitance value to the relay capacitance value by switching on or off all semiconductor switches that need to be switched for the change to the target capacitance value among semiconductor switches belonging to a group, for which a value of the capacitance value range is the largest, among a plurality of groups, each group including a semiconductor switch that needs to be switched on or off.

5. The impedance adjustment device according to claim 1, wherein the processor changes the capacitance value to the relay capacitance value by switching on or off a semiconductor switch included in one of the plurality of capacitor circuits.

* * * * *